(12) United States Patent
Kawasaki

(10) Patent No.: US 6,232,894 B1
(45) Date of Patent: May 15, 2001

(54) REPRODUCIBLE DATA CONVERSION AND/OR COMPRESSION METHOD OF DIGITAL SIGNALS AND A DATA CONVERTER AND A DIGITAL COMPUTER

(75) Inventor: Hiroyuki Kawasaki, Hamamatsu (JP)

(73) Assignee: Kokochi Sangyo Co., Ltd., Hamamatsu (JP)

( * ) Notice: Subject to any disclaimer, the term of this patent is extended or adjusted under 35 U.S.C. 154(b) by 0 days.

(21) Appl. No.: 09/652,567

(22) Filed: Aug. 31, 2000

Related U.S. Application Data

(63) Continuation-in-part of application No. 09/312,347, filed on May 14, 1999, now abandoned.

(30) Foreign Application Priority Data

May 15, 1998 (JP) .................................................. 10-133927

(51) Int. Cl.[7] .................................................. H03M 7/02
(52) U.S. Cl. .......................................... 341/83; 364/746.2
(58) Field of Search .................................. 341/83, 82, 80, 341/67, 87, 56, 57, 60, 61, 746.2; 708/491, 493

(56) References Cited

U.S. PATENT DOCUMENTS 5,153,847 * 10/1992 Tagaki et al. ..................... 364/746.2
5,570,309 * 10/1996 Miyoshi et al. .................. 364/746.2

\* cited by examiner

*Primary Examiner*—Brian Young
*Assistant Examiner*—John Nguyen
(74) *Attorney, Agent, or Firm*—Flynn, Thiel, Boutell & Tanis, P.C.

(57) ABSTRACT

HEN2, which is a combination of signals in which at least one of two adjacent digits at any digit position of one or more digits of a 2-based three digit redundant binary number with one signal of three digits {n, o, p} each expressing value {-1, 0, 1} as a one-digit signal is a signal "o" expressing zero, is handled as one set of notation, not as a subset of the three digit redundant binary number.

9 Claims, 32 Drawing Sheets

Fig.2
(A) integer with sign (s_int)
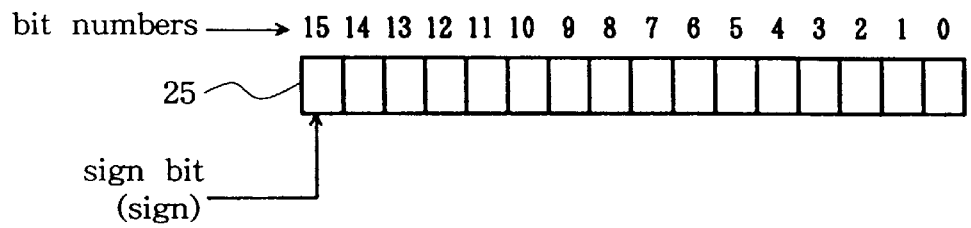
(B) integer with no sign (u_int)
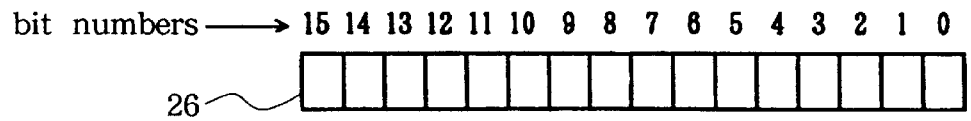
(C) exponent with sign (exp)
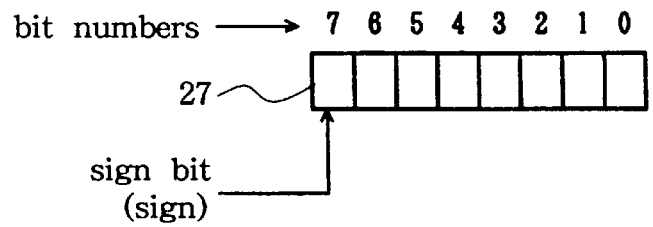

Fig.3
(A) fixed length fixed point mantissa with exponent (float)
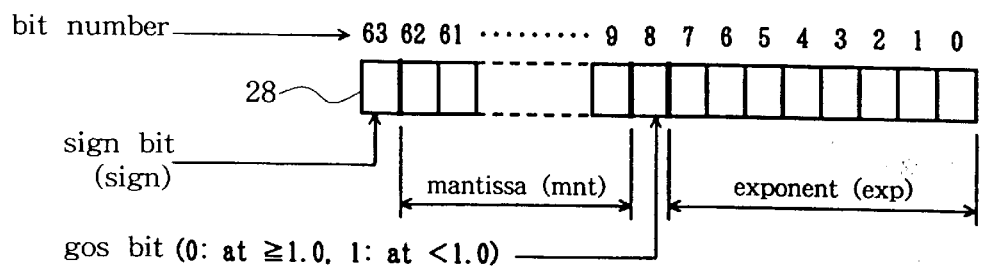
sign bit (sign)
gos bit (0: at ≧1.0, 1: at <1.0)
(B) fixed length fixed point fraction with exponent (fract)
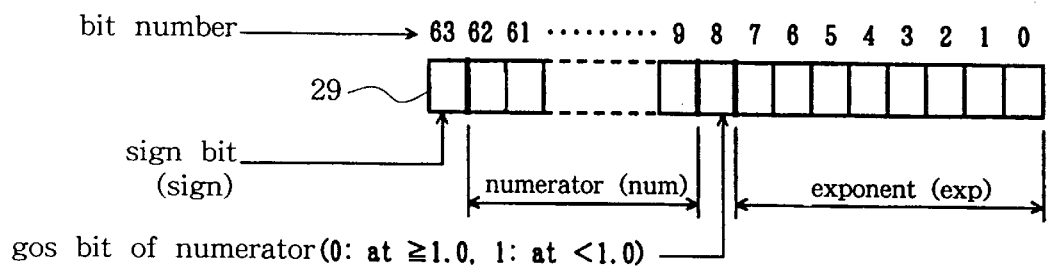
sign bit (sign)
gos bit of numerator (0: at ≧1.0, 1: at <1.0)
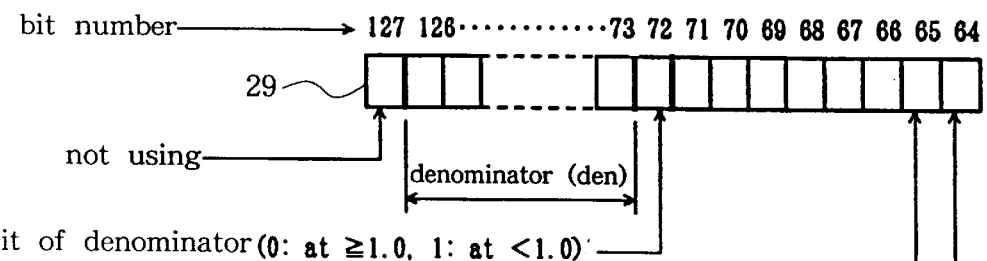
not using
gos bit of denominator (0: at ≧1.0, 1: at <1.0)
essential information
    an index indicating reduced (0)
        /not reduced (1)
    an index indicating real number (0)
        /imaginary number (1)

Fig.4
(A) integer (int)
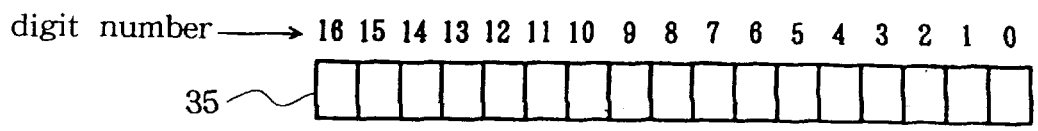
(B) exponent (exp)
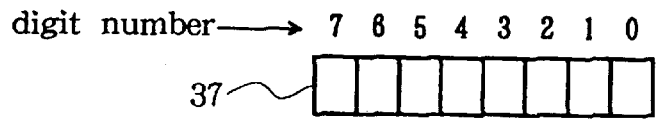

Fig.6

| decimal numbers DEC | two digit binary numbers (B) (s_int) | HEN2 (H) | compressed HEN2 (P) | compressed 4-digit bin. nos. (D) |
|---|---|---|---|---|
| -32,768 | 1000 0000 0000 0000 | nooo 0000 0000 0000 | noppno | noddd |
| -32,767 | 1000 0000 0000 0001 | nooo 0000 0000 ooop | nopnpop | nodpdp |
| -32,766 | 1000 0000 0000 0010 | nooo 0000 0000 oopo | nopnnopo | nododpo |
| -32,765 | 1000 0000 0000 0011 | nooo 0000 0000 opon | nonppopn | nodndpn |
| -32,764 | 1000 0000 0000 0100 | nooo 0000 0000 opoo | nonppopoo | nodndpd |
| -1,025 | 1111 1011 1111 1111 | noo 0000 ooon | nonnnon | noddon |
| -1,024 | 1111 1100 0000 0000 | noo 0000 0000 | nonnpo | ndodo |
| -1,023 | 1111 1100 0000 0001 | noo 0000 ooop | nonnnop | noddop |
| -1,022 | 1111 1100 0000 0010 | noo 0000 oopo | noppopo | noddpo |
| -1,021 | 1111 1100 0000 0011 | noo 0000 opon | nopnopn | ndddpn |
| -1,020 | 1111 1100 0000 0100 | noo 0000 opoo | nopnopoo | ndddpd |
| -10 | 1111 1111 1111 0110 | nono | nno | nno |
| -9 | 1111 1111 1111 0111 | noon | noon | ndn |
| -8 | 1111 1111 1111 1000 | nooo | nono | ndo |
| -7 | 1111 1111 1111 1001 | noop | noop | ndp |
| -6 | 1111 1111 1111 1010 | nopo | npo | npo |
| -5 | 1111 1111 1111 1011 | non | nn | nn |
| -4 | 1111 1111 1111 1100 | noo | noo | nd |
| -3 | 1111 1111 1111 1101 | nop | np | np |
| -2 | 1111 1111 1111 1110 | no | no | no |
| -1 | 1111 1111 1111 1111 | n | n | n |
| 0 | 0000 0000 0000 0000 | o | o | o |
| 1 | 0000 0000 0000 0001 | p | p | p |
| 2 | 0000 0000 0000 0010 | po | po | po |
| 3 | 0000 0000 0000 0011 | pon | pn | pn |
| 4 | 0000 0000 0000 0100 | poo | poo | pd |
| 5 | 0000 0000 0000 0101 | pop | pp | pp |
| 6 | 0000 0000 0000 0110 | pono | pno | pno |
| 7 | 0000 0000 0000 0111 | poon | poon | pdn |
| 8 | 0000 0000 0000 1000 | pooo | pono | pdo |
| 9 | 0000 0000 0000 1001 | poop | poop | pdp |
| 10 | 0000 0000 0000 1010 | popo | ppo | ppo |
| 11 | 0000 0000 0000 1011 | p onon | pnn | pnn |
| 12 | 0000 0000 0000 1100 | p onoo | pnoo | pnd |
| 13 | 0000 0000 0000 1101 | p onop | pnp | pnp |
| 14 | 0000 0000 0000 1110 | p oono | poono | pdno |
| 15 | 0000 0000 0000 1111 | p ooon | ponon | pdon |
| 16 | 0000 0000 0001 0000 | p oooo | popo | pdd |
| 32,765 | 0111 1111 1111 1101 | pooo 0000 0000 onop | ponpponp | podndnp |
| 32,766 | 0111 1111 1111 1110 | pooo 0000 0000 oono | popnnono | pododno |
| 32,767 | 0111 1111 1111 1111 | pooo 0000 0000 ooon | popnpon | podpdn |

Fig.7

| decimal numbers DEC | two digit binary numbers (B) (u_int) | HEN2 (H) | compressed HEN2 (P) | compressed 4-digit bin. nos. (D) |
|---|---|---|---|---|
| 0 | 0000 0000 0000 0000 | o | o | o |
| 1 | 0000 0000 0000 0001 | p | p | p |
| 2 | 0000 0000 0000 0010 | po | po | po |
| 3 | 0000 0000 0000 0011 | pon | pn | pn |
| 4 | 0000 0000 0000 0100 | poo | poo | pd |
| 5 | 0000 0000 0000 0101 | pop | pp | pp |
| 6 | 0000 0000 0000 0110 | pono | pno | pno |
| 7 | 0000 0000 0000 0111 | poon | poon | pdn |
| 8 | 0000 0000 0000 1000 | pooo | pono | pdo |
| 9 | 0000 0000 0000 1001 | poop | poop | pdp |
| 10 | 0000 0000 0000 1010 | popo | ppo | ppo |
| 11 | 0000 0000 0000 1011 | p onon | pnn | pnn |
| 12 | 0000 0000 0000 1100 | p onoo | pnoo | pnd |
| 13 | 0000 0000 0000 1101 | p onop | pnp | pnp |
| 14 | 0000 0000 0000 1110 | p oono | poono | pdno |
| 15 | 0000 0000 0000 1111 | p ooon | ponon | pdon |
| 16 | 0000 0000 0001 0000 | p 0000 | popo | pdd |
| 1,022 | 0000 0011 1111 1110 | poo 0000 oono | poppono | poddno |
| 1,023 | 0000 0011 1111 1111 | poo 0000 ooon | ponnnon | poddon |
| 1,024 | 0000 0100 0000 0000 | poo 0000 0000 | ponnpo | pdodo |
| 1,025 | 0000 0100 0000 0001 | poo 0000 ooop | ponnnop | poddop |
| 1,026 | 0000 0100 0000 0010 | poo 0000 oopo | poppopo | poddpo |
| 1,027 | 0000 0100 0000 0011 | poo 0000 opon | popnopn | pdddpn |
| 32,765 | 0111 1111 1111 1101 | pooo 0000 0000 onop | ponpponp | podndnp |
| 32,766 | 0111 1111 1111 1110 | pooo 0000 0000 oono | popnnono | pododno |
| 32,767 | 0111 1111 1111 1111 | pooo 0000 0000 ooon | popnpon | podpdn |
| 32,768 | 1000 0000 0000 0000 | pooo 0000 0000 0000 | poppno | poddd |
| 32,769 | 1000 0000 0000 0001 | pooo 0000 0000 ooop | popnpop | podpdp |
| 32,770 | 1000 0000 0000 0010 | pooo 0000 0000 oopo | popnnopo | pododpo |
| 32,771 | 1000 0000 0000 0011 | pooo 0000 0000 opon | ponppopn | podndpn |
| 32,772 | 1000 0000 0000 0100 | pooo 0000 0000 opoo | ponppopoo | podndpd |
| 65,526 | 1111 1111 1111 0110 | p 0000 0000 0000 nono | ponpponno | podndnno |
| 65,527 | 1111 1111 1111 0111 | p 0000 0000 0000 noon | ponpponoon | podndndn |
| 65,528 | 1111 1111 1111 1000 | p 0000 0000 0000 nooo | ponpponono | podndndo |
| 65,529 | 1111 1111 1111 1001 | p 0000 0000 0000 noop | ponpponoop | podndndp |
| 65,530 | 1111 1111 1111 1010 | p 0000 0000 0000 nopo | ponpponpo | podndnpo |
| 65,531 | 1111 1111 1111 1011 | p 0000 0000 0000 onon | popnnonn | pododnn |
| 65,532 | 1111 1111 1111 1100 | p 0000 0000 0000 onoo | popnnoonoo | pododnd |
| 65,533 | 1111 1111 1111 1101 | p 0000 0000 0000 onop | popnnonp | pododnp |
| 65,534 | 1111 1111 1111 1110 | p 0000 0000 0000 oono | popnpono | podpdno |
| 65,535 | 1111 1111 1111 1111 | p 0000 0000 0000 ooon | poppnon | podddn |

Fig.8

| HEN2 (H) | no. of contin. dig. of 'o' | compressed HEN2 (P) | compressed 4-digit bin. nos. (D) |
|---|---|---|---|
| (the middle) o | 1 | (cut off) | (cut off) |
| (the end) o | 1 | o | o |
| oo | 2 | oo | d |
| ooo | 3 | ono | do |
| oooo | 4 | opo | dd |
| o oooo | 5 | onno | ddo |
| oo oooo | 6 | onpo | dod |
| ooo oooo | 7 | opno | ddd |
| oooo oooo | 8 | oppo | odd |
| o oooo oooo | 9 | onnno | oddo |
| oo oooo oooo | 10 | onnpo | dodo |
| ooo oooo oooo | 11 | onpno | dddo |
| oooo oooo oooo | 12 | onppo | odnd |
| o oooo oooo oooo | 13 | opnno | odod |
| oo oooo oooo oooo | 14 | opnpo | odpd |
| ooo oooo oooo oooo | 15 | oppno | oddd |
| oooo oooo oooo oooo | 16 | opppo | odndo |
| o oooo oooo oooo oooo | 17 | onnnno | ododo |
| oo oooo oooo oooo oooo | 18 | onnnpo | odpdo |
| ooo oooo oooo oooo oooo | 19 | onnpno | odddo |
| oooo oooo oooo oooo oooo | 20 | onnppo | odnnd |

Fig.10

| HEN3 (T) | 2-digit binary numbers (B) | HEN3 (T) | 2-digit binary numbers (B) | HEN3 (T) | 2-digit binary numbers (B) | HEN3 (T) | 2-digit binary numbers (B) | HEN3 (T) | 2-digit binary numbers (B) | HEN3 (T) | 2-digit binary numbers (B) |
|---|---|---|---|---|---|---|---|---|---|---|---|
| nnnnn | 1000 0111 | nooop | 1011 0000 | onnno | 1101 1001 | ooopn | 0000 0010 | pnnnp | 0010 1011 | poopo | 0101 0100 |
| nnnno | 1000 1000 | noopn | 1011 0001 | onnnp | 1101 1010 | ooopo | 0000 0011 | pnnon | 0010 1100 | poopp | 0101 0101 |
| nnnnp | 1000 1001 | noopo | 1011 0010 | onnon | 1101 1011 | ooopp | 0000 0100 | pnnoo | 0010 1101 | popnn | 0101 0110 |
| nnnon | 1000 1010 | noopp | 1011 0011 | onnoo | 1101 1100 | oopnn | 0000 0101 | pnnop | 0010 1110 | popno | 0101 0111 |
| nnnoo | 1000 1011 | nopnn | 1011 0100 | onnop | 1101 1101 | oopno | 0000 0110 | pnnpn | 0010 1111 | popnp | 0101 1000 |
| nnnop | 1000 1100 | nopno | 1011 0101 | onnpn | 1101 1110 | oopnp | 0000 0111 | pnnpo | 0011 0000 | popon | 0101 1001 |
| nnnpn | 1000 1101 | nopnp | 1011 0110 | onnpo | 1101 1111 | oopon | 0000 1000 | pnnpp | 0011 0001 | popoo | 0101 1010 |
| nnnpo | 1000 1110 | nopon | 1011 0111 | onnpp | 1110 0000 | oopoo | 0000 1001 | pnonn | 0011 0010 | popop | 0101 1011 |
| nnnpp | 1000 1111 | nopoo | 1011 1000 | ononn | 1110 0001 | oopop | 0000 1010 | pnono | 0011 0011 | poppn | 0101 1100 |
| nnonn | 1001 0000 | nopop | 1011 1001 | onono | 1110 0010 | ooppn | 0000 1011 | pnonp | 0011 0100 | poppo | 0101 1101 |
| nnono | 1001 0001 | noppn | 1011 1010 | ononp | 1110 0011 | ooppo | 0000 1100 | pnoon | 0011 0101 | poppp | 0101 1110 |
| nnonp | 1001 0010 | noppo | 1011 1011 | onoon | 1110 0100 | ooppp | 0000 1101 | pnooo | 0011 0110 | ppnnn | 0101 1111 |
| nnoon | 1001 0011 | noppp | 1011 1100 | onooo | 1110 0101 | opnnn | 0000 1110 | pnoop | 0011 0111 | ppnno | 0110 0000 |
| nnooo | 1001 0100 | npnnn | 1011 1101 | onoop | 1110 0110 | opnno | 0000 1111 | pnopn | 0011 1000 | ppnnp | 0110 0001 |
| nnoop | 1001 0101 | npnno | 1011 1110 | onopn | 1110 0111 | opnnp | 0001 0000 | pnopo | 0011 1001 | ppnon | 0110 0010 |
| nnopn | 1001 0110 | npnnp | 1011 1111 | onopo | 1110 1000 | opnon | 0001 0001 | pnopp | 0011 1010 | ppnoo | 0110 0011 |
| nnopo | 1001 0111 | npnon | 1100 0000 | onopp | 1110 1001 | opnoo | 0001 0010 | pnpnn | 0011 1011 | ppnop | 0110 0100 |
| nnopp | 1001 1000 | npnoo | 1100 0001 | onpnn | 1110 1010 | opnop | 0001 0011 | pnpno | 0011 1100 | ppnpn | 0110 0101 |
| nnpnn | 1001 1001 | npnop | 1100 0010 | onpno | 1110 1011 | opnpn | 0001 0100 | pnpnp | 0011 1101 | ppnpo | 0110 0110 |
| nnpno | 1001 1010 | npnpn | 1100 0011 | onpnp | 1110 1100 | opnpo | 0001 0101 | pnpon | 0011 1110 | ppnpp | 0110 0111 |
| nnpnp | 1001 1011 | npnpo | 1100 0100 | onpon | 1110 1101 | opnpp | 0001 0110 | pnpoo | 0011 1111 | pponn | 0110 1000 |
| nnpon | 1001 1100 | npnpp | 1100 0101 | onpoo | 1110 1110 | oponn | 0001 0111 | pnpop | 0100 0000 | ppono | 0110 1001 |
| nnpoo | 1001 1101 | nponn | 1100 0110 | onpop | 1110 1111 | opono | 0001 1000 | pnppn | 0100 0001 | pponp | 0110 1010 |
| nnpop | 1001 1110 | npono | 1100 0111 | onppn | 1111 0000 | oponp | 0001 1001 | pnppo | 0100 0010 | ppoon | 0110 1011 |
| nnppn | 1001 1111 | nponp | 1100 1000 | onppo | 1111 0001 | opoon | 0001 1010 | pnppp | 0100 0011 | ppooo | 0110 1100 |
| nnppo | 1010 0000 | npoon | 1100 1001 | onppp | 1111 0010 | opooo | 0001 1011 | ponnn | 0100 0100 | ppoop | 0110 1101 |
| nnppp | 1010 0001 | npooo | 1100 1010 | oonnn | 1111 0011 | opoop | 0001 1100 | ponno | 0100 0101 | ppopn | 0110 1110 |
| nonnn | 1010 0010 | npoop | 1100 1011 | oonno | 1111 0100 | opopn | 0001 1101 | ponnp | 0100 0110 | ppopo | 0110 1111 |
| nonno | 1010 0011 | npopn | 1100 1100 | oonnp | 1111 0101 | opopo | 0001 1110 | ponon | 0100 0111 | ppopp | 0111 0000 |
| nonnp | 1010 0100 | npopo | 1100 1101 | oonon | 1111 0110 | opopp | 0001 1111 | ponoo | 0100 1000 | pppnn | 0111 0001 |
| nonon | 1010 0101 | npopp | 1100 1110 | oonoo | 1111 0111 | oppnn | 0010 0000 | ponop | 0100 1001 | pppno | 0111 0010 |
| nonoo | 1010 0110 | nppnn | 1100 1111 | oonop | 1111 1000 | oppno | 0010 0001 | ponpn | 0100 1010 | pppnp | 0111 0011 |
| nonop | 1010 0111 | nppno | 1101 0000 | oonpn | 1111 1001 | oppnp | 0010 0010 | ponpo | 0100 1011 | pppon | 0111 0100 |
| nonpn | 1010 1000 | nppnp | 1101 0001 | oonpo | 1111 1010 | oppon | 0010 0011 | ponpp | 0100 1100 | pppoo | 0111 0101 |
| nonpo | 1010 1001 | nppon | 1101 0010 | oonpp | 1111 1011 | oppoo | 0010 0100 | poonn | 0100 1101 | pppop | 0111 0110 |
| nonpp | 1010 1010 | nppoo | 1101 0011 | ooonn | 1111 1100 | oppop | 0010 0101 | poono | 0100 1110 | ppppn | 0111 0111 |
| noonn | 1010 1011 | nppop | 1101 0100 | ooono | 1111 1101 | opppn | 0010 0110 | poonp | 0100 1111 | ppppo | 0111 1000 |
| noono | 1010 1100 | npppn | 1101 0101 | ooonp | 1111 1110 | opppo | 0010 0111 | pooon | 0101 0000 | ppppp | 0111 1001 |
| noonp | 1010 1101 | npppo | 1101 0110 | oooon | 1111 1111 | opppp | 0010 1000 | poooo | 0101 0001 | | |
| nooon | 1010 1110 | npppp | 1101 0111 | ooooo | 0000 0000 | pnnnn | 0010 1001 | pooop | 0101 0010 | | |
| noooo | 1010 1111 | onnnn | 1101 1000 | oooop | 0000 0001 | pnnno | 0010 1010 | poopn | 0101 0011 | | |

Fig.11 to arrange groups of compressed HEN2

| noppno | nopnpop | nopnnopo | nonppopn | nonppopoo | nonnnon | nonnpo |
|---|---|---|---|---|---|---|
| nonnnop | noppopo | nopnopn | nopnopoo | nno | noon | nono |
| noop | npo | nn | noo | np | no | n |
| o | p | po | pn | poo | pp | pno |
| poon | pono | poop | ppo | pnn | pnoo | pnp |
| poono | ponon | popo | ponpponp | popnnono | popnpon | | to insert a par. sign 'k' bet. nu. vals.

k [noppno] k [nopnpop] k [nopnnopo] k [nonppopn] k [nonppopoo] k [nonnnon] k
[nonnpo] k [nonnnop] k [noppopo] k [nopnopn] k [nopnopoo] k [nno] k [noon] k
[nono] k [noop] k [npo] k [nn] k [noo] k [np] k [no] k [n] k [o] k [p] k [po] k
[pn] k [poo] k [pp] k [pno] k [poon] k [pono] k [poop] k [ppo] k [pnn] k [pnoo]
k [pnp] k [poono] k [ponon] k [popo] k [ponpponp] k [popnnono] k [popnpon] k to divide 4 digs. by 4 digs.

| knop | pnok | nopn | popk | nopn | nopo | knon | ppop | nkno | nppo | pook | nonn |
|---|---|---|---|---|---|---|---|---|---|---|---|
| nonk | nonn | pokn | onnn | opkn | oppo | pokn | opno | pnkn | opno | pook | nnok |
| noon | knon | okno | opkn | pokn | nkno | oknp | knok | nkok | pkpo | kpnk | pook |
| ppkp | nokp | oonk | pono | kpoo | pkpp | okpn | nkpn | ookp | npkp | oono | kpon |
| onkp | opok | ponp | ponp | kpop | nnon | okpo | pnpo | nkkk | | | | to substitute B for the 4 digs. of nos. regarding it as 4 val. sigs.

| 1011 0001 | 0111 0010 | 1100 0111 | 0100 0110 | 1100 0111 | 1100 0100 | 1011 0011 |
|---|---|---|---|---|---|---|
| 0101 0001 | 1110 1100 | 1101 0100 | 0100 0010 | 1100 1111 | 1100 1110 | 1100 1111 |
| 0100 1011 | 0011 1111 | 0001 1011 | 0001 0100 | 0100 1011 | 0001 1100 | 0111 1011 |
| 0001 1100 | 0100 0010 | 1111 0010 | 1100 0011 | 1011 0011 | 0010 1100 | 0001 1011 |
| 0100 1011 | 1110 1100 | 0010 1101 | 1011 0010 | 1110 0010 | 0110 0100 | 1001 1110 |
| 0100 0010 | 0101 1001 | 1100 1001 | 0000 1110 | 0100 1100 | 1001 0000 | 0110 0101 |
| 0010 0111 | 1110 0111 | 0000 1001 | 1101 1001 | 0000 1100 | 1001 0011 | 0011 1001 |
| 0001 0010 | 0100 1101 | 0100 1101 | 1001 0001 | 1111 0011 | 0010 0100 | 0111 0100 |
| 1110 1010 | | | | | | |

Fig.12

| one digit of compressed HEN2 regarding the four value signals (P) | two bits binary numbers (B) |
|---|---|
| k | 10 |
| n | 11 |
| o | 00 |
| p | 01 |

Fig.17

| decimal numbers DEC | HEN2 (H) | three digit redundant binary numbers (R) | | | | | | | | |
|---|---|---|---|---|---|---|---|---|---|---|
| -20 | n onoo | | | | | | | | | n onoo |
| -19 | n onop | | | | | | | | n oonn | n onop |
| -18 | n oono | | | | | | | | | n oono |
| -17 | n ooon | | | | | | | | n ooon | n oonp |
| -16 | n oooo | | | | | | | | n oooo | |
| -15 | n ooop | | | | | | | nnnn | n ooop | n oopn |
| -14 | n oopo | | | | | | | nnno | | n oopo |
| -13 | n opon | | | | | | | nnon | nnnp | n oopp | n opon |
| -12 | n opoo | | | | | | | nnoo | | | n opoo |
| -11 | n opop | | | | | | nonn | nnop | nnpn | n oppn | n opop |
| -10 | nono | | | | | | nono | | nnpo | n oppo | |
| -9 | noon | | | | | noon | nonp | | nnpp | n oppp | n poon |
| -8 | nooo | | | | | nooo | | | | | n pooo |
| -7 | noop | | | | nnn | noop | nopn | | npnn | | n poop | n popn |
| -6 | nopo | | | | | nno | | nopo | | npno | | n popo |
| -5 | non | | | non | nnp | | nopp | npon | npnp | n ppon | | n popp |
| -4 | noo | | | noo | | | | npoo | | n ppoo | | |
| -3 | nop | | nn | nop | npn | | | npop | nppn | n ppop | n pppn | |
| -2 | no | | no | | npo | | | | nppo | | n pppo | |
| -1 | n | n | np | | npp | | | | nppp | | n pppp | |
| 0 | o | o | | | | | | | | | | |
| 1 | p | p | pn | | pnn | | | | pnnn | | p nnnn | |
| 2 | po | | po | | pno | | | | pnno | | p nnno | |
| 3 | pon | | pp | pon | pnp | | | pnon | pnnp | p nnon | p nnnp | |
| 4 | poo | | | poo | | | | pnoo | | p nnoo | | |
| 5 | pop | | | pop | ppn | | ponn | pnop | pnpn | p nnop | | p nonn |
| 6 | pono | | | | ppo | | pono | | pnpo | | | p nono |
| 7 | poon | | | | ppp | poon | ponp | | pnpp | | p noon | p nonp |
| 8 | pooo | | | | | pooo | | | | | p nooo | |
| 9 | poop | | | | | poop | popn | | ppnn | p nopn | | p noop |
| 10 | popo | | | | | | popo | | ppno | p nopo | | |
| 11 | p onon | | | | | | popp | ppon | ppnp | p nopp | | p onon |
| 12 | p onoo | | | | | | | ppoo | | | | p onoo |
| 13 | p onop | | | | | | ppop | pppn | | p oonn | p onop |
| 14 | p oono | | | | | | | pppo | | p oono | |
| 15 | p ooon | | | | | | | pppp | | p ooon | p oonp |
| 16 | p oooo | | | | | | | | | p oooo | |
| 17 | p ooop | | | | | | | | | p ooop | p oopn |
| 18 | p oopo | | | | | | | | | | p oopo |
| 19 | p opon | | | | | | | | | p oopp | p opon |
| 20 | p opoo | | | | | | | | | | p opoo |

Fig.20

(A) changing integer number to the standard form of floating-point type

| | | | |
|---|---|---|---|
| 231 — decimal number | 75 | | 107 |
| 232 — HEN2 | poponon | | poononon |
| 233 — float. dec. type of HEN2 | p. oponon   E pono | | p. oononon   E poon |
| 28 — fixed-length fixed pt. mnt. type of 2 dig. bin. no. | sign ¦ mnt<br>0 ¦ 01011 | ¦ gos ¦ exp<br>¦ 0 ¦ 0110 | sign ¦ mnt ¦ gos ¦ exp<br>0 ¦ 010101 ¦ 1 ¦ 0111 |
| 235 — float. pt. type of 3 dig. redun. bin. no. | p. oopopp   E ppo | | p. oononon   E ppp |

(B) a fraction type of real number

| | |
|---|---|
| 20 — fraction number expressed by decimal numbers | 75 / 107 |
| 241 — fraction by HEN2 | poponon / poononon |
| 242 — fraction type by HEN2 with exponent | p. oponon / p. oononon   E n |
| 29 — fixed-point fraction type with exponent of two digit binary system | sign ¦ num or den ¦ gos ¦ exp<br>0 ¦ 01011 ¦ 0 ¦ 11111111<br>¦ 010101 ¦ 1 ¦ |
| 244 — frac. type of 3 dig. redun. bin. syst. | p. oopopp / p. oononon   E npppppp |

(C) infinite decimal is converted to the standard form of floating-point type

| | |
|---|---|
| 251 — IF. dec. in the 2 dig. bin. syst. | 0.00000010011001000111111000110100··· |
| 252 — IF. dec. in HEN2 | o.ooooooponoopoopoooonooponopoo··· |
| 253 — float.-pt. type of HEN2 | p. oponoopoopoooonooponopoo···   E noop |
| 28 — fixed pt. mnt. type w. exp. of 2 dig. bin. syst. | sign ¦ mnt ¦ gos ¦ exp<br>0 ¦ 011001000111110001101000··· ¦ 0 ¦ 11111001 |
| 255 — float.-pt. type of 3 dig. redun. bin. syst. | p. ooppoopooopppppoooppopoo···   E nppppoop |

Fig.22

(A) an addition table for two digit binary numbers (B)

| augends / addends | 0 0 | 0 1 | 1 0 | 1 1 |
|---|---|---|---|---|
| 0 0 | 0 0 | 0 1 | 1 0 | 1 1 |
| 0 1 | 0 1 | 1 0 | 1 1 | 1 0 0 |
| 1 0 | 1 0 | 1 1 | 1 0 0 | 1 0 1 |
| 1 1 | 1 1 | 1 0 0 | 1 0 1 | 1 1 0 |

(B) an addition table for three digit redundant binary numbers (R)

| augends / addends | nn | no | np | on | oo | op | pn | po | pp |
|---|---|---|---|---|---|---|---|---|---|
| nn | nno | non | noo | noo | nn | no | no | on | oo |
| no | non | noo | nop | nn | no | np | on | oo | op |
| np | noo | nop | npo | no | np | oo | oo | op | po |
| on | noo | nn | no | no | on | oo | oo | pn | po |
| oo | nn | no | np | on | oo | op | pn | po | pp |
| op | no | np | oo | oo | op | po | po | pp | poo |
| pn | no | on | oo | oo | pn | po | pno | pon | poo |
| po | on | oo | op | pn | po | pp | pon | poo | pop |
| pp | oo | op | po | po | pp | poo | poo | pop | ppo |

(C) an addition table for HEN2 (H)

| augends / addends | no | on | oo | op | po |
|---|---|---|---|---|---|
| on | nn | no | on | oo | pn |
| oo | no | on | oo | op | po |
| op | np | oo | op | po | pp |

(D) an addition table for HEN3 (T)

| augends / addends | n | o | p |
|---|---|---|---|
| n | np | on | oo |
| o | on | oo | op |
| p | oo | op | pn |

Fig.23

(A) a multiplication table for two digit binary numbers (B)

| multiplier \ multiplicand | 0 0 | 0 1 | 1 0 | 1 1 |
|---|---|---|---|---|
| 0 | 0 0 | 0 0 | 0 0 | 0 0 |
| 1 | 0 0 | 0 1 | 1 0 | 1 1 |

327 — multiplicand
326 — multiplier
306 —

(B) a multiplication table for three digit redundant binary numbers (R)

| multiplier \ multiplicand | n n | n o | n p | o n | o o | o p | p n | p o | p p |
|---|---|---|---|---|---|---|---|---|---|
| n | p p | p o | p n | o p | o o | o n | n p | n o | n n |
| o | 0 0 | 0 0 | 0 0 | 0 0 | 0 0 | 0 0 | 0 0 | 0 0 | 0 0 |
| p | n n | n o | n p | o n | o o | o p | p n | p o | p p |

327, 326, 307

(C) a multiplication table for HEN2 (H)

| multiplier \ multiplicand | n o | o n | o o | o p | p o |
|---|---|---|---|---|---|
| n | p o | o p | o o | o n | n o |
| o | o o | o o | o o | o o | o o |
| p | n o | o n | o o | o p | p o |

327, 326, 308

(D) a multiplication table for HEN3 (T)

| multiplier \ multiplicand | n n | n o | n p | o n | o o | o p | p n | p o | p p |
|---|---|---|---|---|---|---|---|---|---|
| n | p p | p o | p n | o p | o o | o n | n p | n o | n n |
| o | 0 0 | 0 0 | 0 0 | 0 0 | 0 0 | 0 0 | 0 0 | 0 0 | 0 0 |
| p | n n | n o | n p | o n | o o | o p | p n | p o | p p |

| left six digits of divisor | left four digits of partial dividend ||||||||
|---|---|---|---|---|---|---|---|---|
| | 1000 | 1001 | 1010 | 1011 | 1100 | 1101 | 1110 | 1111 |
| 100000 | 11111 | 10001 | 10011 | 10101 | 10111 | 11001 | 11011 | 11101 |
| 100001 | 1111 | 100001 | 100101 | 101001 | 101101 | 11 | 1101 | 111 |
| 100010 | 11101 | 1 | 1001 | 101 | 101011 | 101111 | 110011 | 11011 |
| 100011 | 111 | 1 | 100011 | 100111 | 10101 | 10111 | 110001 | 110101 |
| 100100 | 110111 | 11111 | 10001 | 10011 | 101001 | 1011 | 11 | 110011 |
| 100101 | 110101 | 1111 | 100001 | 100101 | 101 | 101011 | 101111 | 11001 |
| 100110 | 1101 | 111011 | 1 | 1001 | 100111 | 10101 | 101101 | 110001 |
| 100111 | 110011 | 111001 | 1 | 100011 | 10011 | 101001 | 1011 | 11 |
| 101000 | 110001 | 111 | 11111 | 10001 | 100101 | 101 | 101011 | 10111 |
| 101001 | 11 | 11011 | 1111 | 100001 | 1001 | 100111 | 10101 | 101101 |
| 101010 | 101111 | 110101 | 111011 | 1 | 100011 | 10011 | 101001 | 1011 |
| 101011 | 10111 | 1101 | 11101 | 1 | 10001 | 100101 | 101 | 101011 |
| 101100 | 101101 | 110011 | 111 | 11111 | 10001 | 1001 | 100111 | 10101 |
| 101101 | 1011 | 11001 | 110111 | 111101 | 100001 | 1001 | 10011 | 101001 |
| 101110 | 101011 | 110001 | 11011 | 111011 | 1 | 100011 | 10011 | 101 |
| 101111 | 10101 | 11 | 110101 | 11101 | 1 | 10001 | 100101 | 101 |
| 110000 | 101001 | 101111 | 1101 | 111001 | 11111 | 100001 | 1001 | 100111 |
| 110001 | 101 | 10111 | 110011 | 111 | 111101 | 100001 | 100011 | 10011 |
| 110010 | 101 | 101101 | 11001 | 110111 | 1111 | 1 | 100011 | 100101 |
| 110011 | 100111 | 1011 | 110001 | 11011 | 111011 | 1 | 10001 | 1001 |
| 110100 | 10011 | 101011 | 11 | 110101 | 111001 | 11111 | 100001 | 1001 |
| 110101 | 100101 | 10101 | 101111 | 1101 | 111 | 111101 | 100001 | 100011 |
| 110110 | 100101 | 101001 | 10111 | 110011 | 110111 | 1111 | 1 | 10001 |
| 110111 | 1001 | 101001 | 101101 | 11001 | 11011 | 111011 | 1 | 10001 |
| 111000 | 100011 | 101 | 1011 | 110001 | 110101 | 11101 | 11111 | 100001 |
| 111001 | 100011 | 100111 | 1011 | 11 | 1101 | 111001 | 111101 | 100001 |
| 111010 | 10001 | 100111 | 101011 | 101111 | 1101 | 111 | 1111 | 1 |
| 111011 | 10001 | 10011 | 10101 | 10111 | 110011 | 110111 | 111011 | 1 |
| 111100 | 100001 | 100101 | 101001 | 10111 | 11001 | 11011 | 11101 | 11111 |
| 111101 | 100001 | 100101 | 101001 | 101101 | 110001 | 110101 | 111001 | 111101 |
| 111110 | 1 | 1001 | 101 | 1011 | 11 | 1101 | 111 | 1111 |
| 111111 | 1 | 1001 | 101 | 1011 | 11 | 1101 | 111 | 1111 |

Fig.28

| 1.7 digs. of divisor | left five digits of partial dividend |||||||||||
|---|---|---|---|---|---|---|---|---|---|---|---|
| | ponon | ponoo | ponop | poono | pooon | poooo | pooop | poopo | popon | popoo | popop |
| pononon | p | poop | popoon | pop | ponon | pon | ponoop | poonon | poon | pooon | poooon |
| pononoo | p | poop | popon | pop | pononoon | ponoon | poonopon | ponop | poon | poonop | pooon |
| pononop | p | pooop | poopop | pop | popopop | ponoon | pon | ponop | poonon | poon | pooon |
| ponoono | pooonop | p | poop | pop | popop | ponon | pon | ponoop | ponopop | poon | poonop |
| ponooon | pooon | p | poop | popon | popoop | ponon | ponoon | pon | ponop | poonon | poon |
| ponoooo | poonop | p | pooop | popon | pop | popop | ponoonon | pon | ponoopop | poonon | poon |
| ponooop | poonop | p | pooop | poop | popoon | popop | ponon | pon | ponoop | ponop | poonoon |
| ponoopo | poon | p | poooop | poop | poponop | pop | pononoon | ponoon | ponoooop | ponop | poononoon |
| ponopon | poon | pooon | p | poop | popon | pop | popopop | ponon | pon | ponoop | ponop |
| ponopoo | poonon | pooon | p | pooop | popoop | pop | popop | ponon | ponooon | ponoopop | ponoop |
| ponopop | ponop | poon | p | pooop | poop | pop | popoop | ponon | ponoon | pon | ponoop |
| poonono | ponop | poon | poooon | p | poopoon | popon | pop | popop | ponoop | pon | ponooop |
| poonoon | ponop | poon | ponon | p | poopon | poop | pop | popop | ponon | poonon | pon |
| poonooo | ponoop | poon | pooon | p 361 | poop | poop | poopon | popoop | ponoonon | poonon | pon |
| poonoop | ponoop | poon | pooon | p | poop | poop | popon | pop | popopop | ponoon | ponooon |
| poonopo | pon | ponop | poonop | p | poooop | poop | poponon | pop | popop | ponon | ponoon |
| pooonon | pon | ponop | poon | pooon | p | poopon | poopop | pop | popop | ponon | ponoon |
| pooonoo | ponooon | ponoop | poon | pooon | p | poop | poop | ponon | popoop | pononon | ponon |
| pooonop | ponoon | pon | poon | pooon | p | poop | poop | ponon | pop | popop | ponon |
| poooono | ponoon | pon | ponon | poon | pooon | p | poopon | poopop | poon | popop | pononon |
| pooooon | ponon | pon | ponop | poon | ponon | p | pooopop | poop | poponop | pop | popop |
| poooooo | ponon | pon | ponop | poon | pooon | p | poop | poop | ponon | pop | popop |
| poooop | ponon | pon | ponop | poon | pooon | p | poopon | poop | poponon | pop | popoop |
| pooopo | popop | pon | ponoop | poon | poonop | p | poop | poopon | poopop | popon | popooop |
| pooopon | popop | pon | ponoop | poonon | poopop | pooon | p | pooop | poop | popon | pop |
| poopoo | popoop | ponoon | ponooop | ponop | poon | pooon | p | pooop | poop | popon | popooon |
| poopop | pop | ponon | pon | ponop | poon | pooon | p | pooop | poopon | popop | popoon |
| poopono | pop | ponon | pon | ponop | poonoon | poonop | poooon | p | poopon | poop | popon |
| poopoon | pop | ponon | ponooon | ponoop | poonon | poon | pooonop | p | pooop | poop | popon |
| poopooo | popoon | popop | ponoon | pon | poonon | poon | poon | p | pooop | poop | poopop |
| poopoop | popon | pop | ponoon | pon | ponop | poon | pooon | p | poooop | poop | poopop |
| poopopo | popon | pop | pononop | pon | ponop | poon | pooonon | p | pooop | poop | poop |
| poponon | popon | pop | ponon | pon | ponop | poon | poonop | poooon | p | pooop | poop |
| poponoo | poopop | pop | ponon | pon | ponoop | poonon | poonoop | pooon | p | pooop | poopon |
| poponop | poop | pop | ponon | pon | ponoop | ponop | poon | pooon | p | poooop | poopon |
| popoono | poop | pop | popop | ponoon | ponooop | ponop | poon | pooon | poooon | p | pooopop |
| popooon | poop | pop | popop | ponoon | pon | ponop | poonoon | ponop | pooon | p | pooop |
| popoooo | poopon | pop | popop | ponon | pon | ponop | ponon | poon | poooonop | p | pooopon |
| popooop | poopon | popon | poop | ponon | pon | ponoop | ponon | poon | pooon | p | pooooop |
| popoopo | poop | popon | pop | ponon | ponooon | ponop | ponoop | poon | pooonon | p | pooooop |
| popopon | pooop | poop | pop | ponon | ponoon | pon | ponop | poon | poonop | pooon | p |
| popopoo | pooop | poop | pop | popoop | ponoon | pon | ponop | poon | poonop | pooon | p |
| popopop | poooop | poop | pop | popop | pononop | pon | ponop | poon | poonoop | pooon | p |

| left four digits of divisor | left three digits of partial dividend | | | | | | | | |
|---|---|---|---|---|---|---|---|---|---|
| | pnn | pno | pnp | pon | poo | pop | ppn | ppo | ppp |
| pnnn | p | pp | ppp | pnn | pnon | pnop | pnp | ponn | ponp |
| pnno | p | ppn | ppp | pnnn | pnnp | pn | pnpn | pnppn | ponnp |
| pnnp | p | pop | pp | pppp | pnn | pnon | pnopn | pnpnp | pnpp |
| pnon | pon | p | ppn | ppp | pnnn | pnnp | pnonp | pnop | pnpon |
| pnoo | pnp | p | popp | pp | pppp | pnn | pnnpp | pn | pnopp |
| pnop | pnp | p | pop | ppn | ppp | pnnn | pnnpn | pnon | pnoop |
| pnpn | pnp | pon | p | ppn | pp | pppp | pnn | pnnp | pnoon |
| pnpo | pn | pon | p | pop | ppon | ppp | pnnn | pnnop | pnonn |
| pnpp | pn | pnp | p | pop | ppn | pp | pppp | pnn | pnnp |
| ponn | pn | pnp | pon | p | ppnn | pp | ppp | pnnn | pnn |
| pono | pn | pnp | pon | p | pop | ppn | ppop | pppp | pnnon |
| ponp | pnn | pnop | ponn | p | pop | ppn | pp | ppp | pnnn |
| poon | pnn | pn | pnp | pon | p | popp | ppnp | ppop | pppp |
| pooo | pnn | pn | pnp | pon | p | pop | ppn | pp | ppp |
| poop | pnn | pn | pnp | pon | p | popn | ppnn | ppon | pppn |
| popn | pnn | pnon | pnpn | pnpp | ponp | p | pop | ppn | pp |
| popo | ppp | pnnp | pn | pnp | pon | p | pop | ppn | ppon |
| popp | pp | pnn | pn | pnp | pon | p | popn | popp | ppnp |
| ppnn | pp | pnn | pn | pnp | ponn | ponp | p | pop | ppn |
| ppno | pp | pnn | pn | pnpn | pnpp | pon | p | pop | ppnn |
| ppnp | pp | pnn | pnon | pnop | pnp | pon | p | popn | popp |
| ppon | pp | pnnn | pnnp | pn | pnp | ponn | ponp | p | pop |
| ppoo | pp | ppp | pnn | pn | pnp | pnpp | pon | p | popn |
| ppop | ppn | ppp | pnn | pn | pnpn | pnpp | pon | p | poop |
| pppn | ppn | pp | pnn | pnon | pnop | pnp | pon | poon | p |
| pppo | pop | pp | pnn | pnon | pn | pnp | ponn | ponp | p |
| pppp | pop | pp | pnn | pnnp | pn | pnp | pnpp | pon | p |

| decimal number DEC (10) | HEN2 (H) (77) | HEN3 (T) (99) | 2 digit binary number (B) (55) |
|---|---|---|---|
| -32,768 | nooo oooo oooo oooo | np poo oop pop | 1000 0000 0000 0000 |
| -16,384 | noo oooo oooo oooo | n pnn nnn pnn | |
| -8,192 | no oooo oooo oooo | nnp npo nnp | |
| -4,096 | n oooo oooo oooo | npo pop pon | |
| -2,048 | nooo oooo oooo | no pnn opp | |
| -1,024 | noo oooo oooo | n nnp opn | |
| -512 | no oooo oooo | n pon oop | |
| -256 | n oooo oooo | noo nnn | |
| -128 | nooo oooo | npp pnp | |
| -64 | noo oooo | np non | |
| -32 | no oooo | n npp | |
| -16 | n oooo | n ppn | |
| -8 | nooo | nop | |
| -4 | noo | nn | |
| -2 | no | np | |
| -1 | n | n | |
| 0 | o | o | 0000 0000 0000 0000 |
| 1 | p | p | 0000 0000 0000 0001 |
| 2 | po | pn | 0000 0000 0000 0010 |
| 4 | poo | pp | 0000 0000 0000 0100 |
| 8 | pooo | pon | 0000 0000 0000 1000 |
| 16 | p oooo | p nnp | 0000 0000 0001 0000 |
| 32 | po oooo | p pnn | 0000 0000 0010 0000 |
| 64 | poo oooo | pn pop | 0000 0000 0100 0000 |
| 128 | pooo oooo | pnn npn | 0000 0000 1000 0000 |
| 256 | p oooo oooo | poo ppp | 0000 0001 0000 0000 |
| 512 | po oooo oooo | p nop oon | 0000 0010 0000 0000 |
| 1,024 | poo oooo oooo | p ppn onp | 0000 0100 0000 0000 |
| 2,048 | pooo oooo oooo | po npp onn | 0000 1000 0000 0000 |
| 4,096 | p oooo oooo oooo | pno non nop | 0001 0000 0000 0000 |
| 8,192 | po oooo oooo oooo | ppn pno ppn | 0010 0000 0000 0000 |
| 16,384 | poo oooo oooo oooo | p npp ppp npp | 0100 0000 0000 0000 |
| 32,768 | pooo oooo oooo oooo | pn noo oon non | |

Fig.32

| decimal number DEC | HEN3 (T) | HEN2 (H) | 2 digit binary number (B) |
|---|---|---|---|
| -19,683 | n 000 000 000 | non opon oopo onop | 1011 0011 0001 1101 |
| -6,561 | noo 000 000 | no pono pono ooon | 1110 0110 0101 1111 |
| -2,187 | no 000 000 | nooo noon opop | 1111 0111 0111 0101 |
| -729 | n 000 000 | nop oopo poon | 1111 1101 0010 0111 |
| -243 | noo 000 | n ooop onop | 1111 1111 0000 1101 |
| -81 | no 000 | non ooon | 1111 1111 1010 1111 |
| -27 | n 000 | no opop | 1111 1111 1110 0101 |
| -9 | noo | noon | 1111 1111 1111 0111 |
| -3 | no | nop | 1111 1111 1111 1101 |
| -1 | n | n | 1111 1111 1111 1111 |
| 0 | o | o | 0000 0000 0000 0000 |
| 1 | p | p | 0000 0000 0000 0001 |
| 3 | po | pon | 0000 0000 0000 0011 |
| 9 | poo | poop | 0000 0000 0000 1001 |
| 27 | p 000 | po onon | 0000 0000 0001 1011 |
| 81 | po 000 | pop ooop | 0000 0000 0101 0001 |
| 243 | poo 000 | p ooon opon | 0000 0000 1111 0011 |
| 729 | p 000 000 | pon oono noop | 0000 0010 1101 1001 |
| 2,187 | po 000 000 | pooo poop onon | 0000 1000 1000 1011 |
| 6,561 | poo 000 000 | po nopo nopo ooop | 0001 1001 1010 0001 |
| 19,683 | p 000 000 000 | pop onop oono opon | 0100 1100 1110 0011 |

US 6,232,894 B1

REPRODUCIBLE DATA CONVERSION AND/OR COMPRESSION METHOD OF DIGITAL SIGNALS AND A DATA CONVERTER AND A DIGITAL COMPUTER

This application is a continuation-in-part of U.S. Ser. No. 09/312 347, filed May 14, 1999 now abandoned.

1. TITLE OF THE INVENTION

A reproducible data conversion and/or compression method of digital signals and a data converter and a digital computer

2. BACKGROUND OF THE INVENTION

(1) Application Field of the Invention

This invention relates to a method which compresses and reproduce digital data signals such as digital audio signals, digital video signals and digital numerical signals, more particularly to a method which converts digital data binary signals with 2 as base to corresponding compressed digital data signals consisting of numbers of two digit binary system and reproduces them Further, this invention relates to a method which uniquely converts digital data signals of binary numbers with 2 as base to those of ternary numbers with 3 as base, and vice versa. Furthermore, this invention relates to a method which uniquely converts the above-described digital numerical signals to notations which can prevent chain of carry digits to shorten the operation time, when making arithmetical operation using the digital numerical signals, and a method which can shorten operational time using a table of parameters depending on divisor and dividend or a combination of partial dividends, when making divisional calculations, as well as a digital signals and data converter and a digital computer using the above methods.

(2) Description of Prior Art

As well known, with most of the digital data signal processors according to the prior art, digital data signals are processed using numbers of the two digit binary system consisting of two signals {0, 13}. These digital data signals are kept in memory. The digital data signals of two digit binary numbers are also used to send and receive digital data signals by way of communications between other units.

With most of digital signals and data converters and digital computers, numbers of two digit binary system using signal set {0, 1} are processed, and also the calculation results in numbers of the same system. To shorten the operational time, numbers of redundant binary system using three signals {−1, 0, 1} at one digit have been utilized.

In most cases, digital data signals such as digital audio signals, digital video signals and digital numerical signals are handled as a fixed length by the characteristics of their respective signals. For example, when transferring digital numerical signals, if they have a 16 bit fixed length, the same 16 bits are used even to a zero signal which can be expressed by using only one bit. This is because of the following fact: when a cluster of two or more digital data signals is transferred, it is easy to divide each of them into two sets of 16 bits by clearly indicating only the boundary of the starting portion and the end portion, even without specification of the partitions of the individual digital data signals. Further, when digital data signals with various bit numbers are mixed, an indication of the respective bit numbers with variable length having different bit numbers for every digital data signal will need 4 bits to express numbers of 1 to 16 bits, therefore, as a whole, causing the size of individual data signals becoming 5 to 20 bits, thus resulting in an average of bit numbers being larger than 16 bits, that means of no use in reducing bit numbers. Furthermore, in the case of digital video signals, they have less mixing of signals with various bit numbers and more signals using the whole of assigned bit numbers, thus resulting in a rare happening of shorter variable length than fixed length.

Therefore, in spite of the fact that a reduction of the total number of digits as a cluster of data signals can not only minimize necessary memory area, but also make transfer time shorter when loading them on communication means, the aforementioned numbers of two digit binary system cannot reduce the quantity of digital data signals because of their non-redundancy and a possible increase taking place in the quantity of them due to their originally simplest configuration when any slightest signals are added, so that how to compress digital data signals have been a significant problem.

On the other hand, when expressing one numerical value, because of the redundancy which may accommodate a plurality of notations, the aforementioned numbers of three digit binary system may shorten operational time if a notation which may not take place carry digit when making addition, subtraction and multiplication calculations should be selected. But, some contents of two numbers to be processed may necessitate to select alternative notations to each other, thus resulting in a complexity in the conversion process of their numerical signals. Additionally, in the case of divisional calculations, because of the redundancy, only a comparison of digit numbers cannot determine even which numerical value is larger than the other, therefore causing a difficulty in divisional calculation, thus resulting in the need for the solution.

Further, when handling numbers of 3-based ternary system as digital data signal, the conversion between them and numbers of 2-based binary system may be easy when they are integers, but in the case of decimals, one system may be divided out but the other system may often result in recurring decimals, thus causing a difficulty in unique conversion.

Since the divisional calculation takes the longest calculation time among the four rule calculations, an issue was how to reduce the time necessary for the divisional calculation. Such a device has been developed as to make a calculation for determining a reciprocal of a divisor only by a combination of addition, subtruction and multiplication calculations.

3. OUTLINE OF THIS INVENTION

To solve the aforementioned problems, this invention has such configurations as follow:

The invention as described in Claim 1 is a digital data conversion method, which is characterized in that: A three digit nonredundant symmetric binary number (hereinafter referred to as HEN2 by the inventor), which is a combination of signals in which at least one of two adjacent digits at any digit position of one or more digits of 2-based three digit redundant binary number with either one signal of three digits {n, o, p} each expressing value {−1, 0, 1} as one-digit signal is a signal "o" expressing zero, is handled as one independent set of notation, not as a subset of said three digit redundant binary number.

According to the invention as described in Claim 1, the HEN2 to be handled as one notation can eliminate redundancy and uniquely correspond to the numbers of two digit binary system as well as have less ratio of non-zero digits, thereby obtaining a main role in a notation system HEN2 can not only take its position in between two digit nonredundant binary system and three digit nonredundant ternary system, but also become an interface between them because of its non-redundancy.

Further, according to the invention, in the case of addition calculation, adoption of HEN2 for at least one of two numbers to be processed in an arithmetical calculation never causes chain of carry digit, thereby permitting concurrent operation of addition in each digit, thus resulting in a significant reduction in operational time.

In a normal arithmetical operation, the use of HEN2 may have little effect if all the numbers is not converted to HEN2, but in the case of rare overlap of digits of numbers to be processed, which may take place when adding an additional partial quotient to the sum of partial quotients, conversion of either one to HEN2 may be effective. Only once normalization of numbers of three digit redundant binary system to HEN2 will suffice after the final sum is obtained.

In multiplication operation too, HEN2 having less ratio of non-zero digits can reduce the number of partial products by the difference, thereby allowing the calculation to be simplified, thus resulting in shorter calculation time.

Further, according to the invention using HEN2, an arithmetical operation including decimal numbers may have less round-off errors possibly taking place in approximation.

With the HEN2 system, the range of decimals is as follows:

$$p.\ opopop\ldots = 1 + \frac{1}{4} + \frac{1}{16} + \frac{1}{64} + \ldots \text{ nearly equal to } 1 + \frac{1}{3} = \frac{4}{3}$$

$$p.\ ononon\ldots = 1 - \frac{1}{4} - \frac{1}{16} - \frac{1}{64} - \ldots \text{ nearly equal to } 1 - \frac{1}{3} = \frac{2}{3}$$

Therefore, when leaving up to a certain non-zero digit to truncate the following digits (that is, to change the following digits to a signal "o" of zero digit), its resultant round-off error is within + or −⅓ of (2 to the power) expressed by the boundary digit.

Further, a number which is commonly used for, e.g., a floating decimal type of mantissa part of two digit binary system, and numerator and denominator is called here as "rule number". Here, the rule number is provided with a sign bit and a size bit. Then sign bits 0 and 1 are reversed using the rule number, they become additive inverse numbers symmetrical to zero, while, when size bits 0 and 1 are reversed, they become numbers symmetrical to +1 or −1 without changing their sign. In other words, a following operation If positive, $$a = 2 - b$$

or if negative, $$a = -2 + |b|$$

causes only a reversal of size bits, so that this operation is very easy. The frequency of this operation to be used may not be so often as compared to a substitution of positive and negative, but may be used for example when determining the reciprocal by way of Newton-Raphson method.

Additionally, conversion of notations having different base values to HEN2 has been thought difficult, but placement of rule number to numerator and denominator can allow a fraction type with exponent to be used, thus enabling a fine-accuracy conversion even in the case which includes decimal numbers, particularly eliminating the need for thinking about whether the divisional calculation will result in dividing-off or recurring decimal. Further, when HEN2 is used, a divisional calculation whose partial quotient is a coefficient or its reversal determined by a combination of two or more digits including respective non-zero most significant digits of divisor and partial dividend can be finished sooner.

Since partial product, that is a product of divisor and coefficient, can be reutilized, necessary repetitive times of multiplication to calculate partial product can be limited when obtaining a quotient of the same digit number, HEN2 can obtain a right answer with less number of times than calculations by other notations.

Since not only divisors and dividends but also partial quotients and partial dividends can be positive or negative, HEN2 operation can eliminate the need for distinguishing the positive case from the negative case.

In the same way as described above, divisional calculation time of numbers of nonredundant symmetric ternary system (hereinafter referred to as HEN3 by the inventor) can be shortened. Since partial product, that is a product of divisor and coefficient, can be reutilized, necessary repetitive times of multiplication to calculate partial product can be limited. Since not only divisors and dividends but also partial quotients and partial dividends can be positive or negative, HEN3 operation can eliminate the need for distinguishing the positive case from the negative case.

Numbers of two digit binary system may also be subject to a divisional operation similar to the above, but the positive and negative signs of partial dividend must be the same as those of dividend. Therefore, calculation methods with positive and negative dividend are different each other, but a section including a plurality of digits can be similarly calculated concurrently, using the coefficient table.

The invention as described in Claim 2 is a digital data compression method, which is characterized in that: Let us consider numbers of three digit {n, o, p} redundant binary system having one or more 2-based digits, which selects any one of three digit signals {n, o, p} expressing value {−1, 0, 1} as one digit signal. Among the numbers of three digit redundant binary system, only a combination of signals in which at least one of two adjacent digits is a signal "o" expressing zero is called here as HEN2. The HEN2 is not handled as a subset of the numbers of three digit redundant binary system, but as one specific notation. Further, when the zero-digit signal "o" interposed between a non-zero digit (either one of signals "n, p") and the other non-zero digit is only one digit, at least this only one digit "o" is omitted.

According to the invention as described in Claim 2, more strictly than Claim 1, in HEN2, any non-zero digits never take their positions side by side to each other. Therefore, when the zero-digit signal "o" interposed between a non-zero digit (either one of signals "n, p") and the other non-zero digit is only one digit, at least this only one digit "o" is omitted (or cut short) to form a compression type, thus resulting in a reduction of the total number of digits, and in an easy restoration.

The invention as described in Claim 3 is a digital data compression method, which is characterized in that: Let us consider numbers of three digit {n, o, p} redundant binary system having one or more 2-based digits, which selects any one of three digit signals {n, o, p} expressing value {−1, 0, 1} as one digit signal. Among the numbers of three digit redundant binary system, only a combination of signals in which at least one of two adjacent digits is a signal "o" expressing zero is called here as HEN2. The HEN2 is not handled as a subset of the numbers of three digit redundant binary system, but as one specific notation. Further, the number of continual zero digits is coded.

According to the invention as described in Claim 3, more strictly than Claim 1, in HEN2, continual zero digits can frequently take place, so that coding of the number of continual zero digits can achieve a more compact compression. In other words, when digital data signals expressed by two digit binary system is uniquely converted into HEN2, and the HEN2 obtained is compressed and converted into coded two digit binary number, its data volume can be positively reduced as compared to the original.

Later, three compression methods will be exemplified as examples, but any one will not always be useful for compression of data. Compression is useful in the case of inclusive redundancy. With the examples shown in FIGS., 9, 11 and 13, when a compressed two digit binary number is further to be compressed, the number of digits may increase inadvertently. Therefore, when a cluster of two digit binary numbers is repetitively compressed, there may not take place such self-contradiction as the number of digits diminishes step by step.

The invention as described in Claim 4 is a digital signals and digital data converter which comprises: an input portion for inputting digital signals; an output portion for outputting digital signals; and a digital processing unit, in which digital signals and digital data are converted, being characterized in that: Let us consider numbers of three digit {n, o, p} redundant binary system having one or more 2-based digits, which selects any one of three digit signals {n, o, p} expressing value {−1, 0, 1} as one digit signal. Among the numbers of three digit redundant binary system, only a combination of signals in which at least one of two adjacent digits is a signal "o" expressing zero is called here as HEN2. The HEN2 is not handled as a subset of the numbers of three digit redundant binary system, but as one specific notation.

Since the invention as described in Claim 4 uses the digital data conversion method as claimed in Claim 1, and has an input portion for inputting digital signals and an output portion for outputting digital signals, time required for an arithmetical operation is significantly shortened. In this connection, internal processing is black-boxed, so that the operator is not aware of the use of HEN2 in the converter.

The invention as described in Claim 5 is a digital signals and digital data converter which comprises: an input portion for inputting digital signals; an output portion for outputting digital signals; and a digital processing unit, in which digital signals and digital data are converted, being characterized in that: Let us consider numbers of three digit {n, o, p} redundant binary system having one or more 2-based digits, which selects any one of three digit signals {n, o, p} expressing value {−1, 0, 1} as one digit signal. Among the numbers of three digit redundant binary system, only a combination of signals in which at least one of two adjacent digits is a signal "o" expressing zero is called here as HEN2. The HEN2 is not handled as a subset of the numbers of three digit redundant binary system, but as one specific notation. Further, when the zero-digit signal "o" interposed between a non-zero digit (either one of signals "n, p") and the other non-zero digit is only one digit, at least this only one digit "o" is omitted.

According to the invention as described in Claim 5, non-zero digits in HEN2 do not appear side by side more positively than Claim 4. Therefore, when a signal "o" of zero digit taking its position in between a non-zero digit of either one of "n, p" signals and the other non-zero digit is of only one digit, at least "o" of this only one digit is omitted (compacted) for compression, thus resulting in the reduction in the total number of digits and in easy reproduction.

Further, by the use of this black-boxed processing, inputted two digit binary numbers are outputted as compressed two digit binary numbers, and then this compressed two digit binary numbers are inputted, thereby achieving a reproduction (or output) of the original two digit binary numbers. Here, no compression may be one option, if compression should inadvertently increase the resulting number of digits.

The invention as described in Claim 6 is a digital signals and digital data converter which comprises: an input portion for inputting digital signals; an output portion for outputting digital signals; and a digital processing unit, in which digital signals and digital data are converted, being characterized in that: Let us consider numbers of three digit {n, o, p} redundant binary system having one or more 2-based digits, which selects any one of three digit signals {n, o, p} expressing value {−1, 0, 1} as one digit signal. Among the numbers of three digit redundant binary system, only a combination of signals in which at least one of two adjacent digits is a signal "o" expressing zero is called here as HEN2. The HEN2 is not handled as a subset of the numbers of three digit redundant binary system, but as one specific notation. The number of continual zero digits is coded for handling digital signals.

According to the invention as described in Claim 6, since this HEN2 may have more cases of continual zero digits than Claim 4, coding of the number of continual zero digits can all the more compress the data to be handled. In other words, when digital data signals of two digit binary number are uniquely converted into compressed and coded two digit binary numbers, data volume to be handled can be reduced as compared to the one before conversion.

The invention as described in Claim 7 is a digital computer which is characterized in having either one of the digital data converters as claimed in Claim 4 to 6.

According to the invention as described in Claim 7, this specific HEN2 is used when making calculation by this digital computer, while common two digit binary numbers can be used when outputting the result to remote storage media or other digital computers and inputting digital data from storage media or other digital computers. Further, when loading the digital data on communication means, compressed two digit binary number can shorten transfer time. The compressed two digit binary number can reduce the number of storage media to be required.

4. BRIEF DESCRIPTION OF DRAWINGS

FIG. 2 is an illustration showing an integer type of data structure to be placed in a two-digit register;

FIG. 3 is an illustration showing a real number type of data structure to be placed in the two-digit register;

FIG. 4 is an illustration showing an integer type of data structure to be placed in a three-digit register;

FIG. 6 is a table showing examples in which the respective notations of decimal numbers, signed integers of two digit binary system, numbers of symmetric binary system or HEN2, compressed HEN2, and compressed numbers of four digit binary system are uniquely corresponded to one another;

FIG. 7 is a table showing examples in which the respective notations of decimal numbers, unsigned integers of two digit binary system, HEN2, compressed HEN2, and compressed numbers of four digit binary system are uniquely corresponded to one another;

FIG. 8 is a conversion table showing the relation between numbers of continual "o", digits in the notations of HEN2 and coded digits used when making compressed HEN2 and compressed numbers of four digit binary system;

FIG. 10 is a conversion table showing the correspondence between five digits of nonredundant symmetric ternary numbers and eight bits of two digit binary numbers;

FIG. 11 is an illustration showing examples of knop compression process which converts four digit signals, which were made by arranging the numerical groups of compressed HEN2, inserting divisional sign (k) between numerals, and dividing them for every four digits, to a cluster of two digit binary number;

FIG. 12 is a conversion table showing the correspondence between one digit of the compressed HEN2 regarded as four digit signals and two bits of two digit binary numbers;

FIG. 17 is a table showing comparative examples in which same numbers are expressed by HEN2 and three digit redundant binary numbers;

FIG. 20 is a table showing comparative examples in which same real numbers are expressed by HEN2, three digit redundant binary numbers and two digit binary numbers;

FIG. 22 is addition tables for two digit binary numbers, three digit redundant binary numbers, HEN2 and nonredundant symmetric ternary numbers;

FIG. 23 is multiplication tables for two digit binary numbers, three digit redundant binary numbers, HEN2 and nonredundant symmetric ternary numbers;

FIG. 24 is an illustration showing an example of divisional operation of two digit binary number;

FIG. 26 is an illustration showing an example of divisional operation of nonredundant symmetric ternary numbers;

FIG. 27 is a table showing coefficients determined using divisors and partial dividends obtained in the divisional calculation of two digit binary numbers;

FIG. 28 is a table showing coefficients determined using divisors and partial dividends obtained in the divisional calculation of HEN2;

FIG. 29 is a table showing coefficients determined using divisors and partial dividends obtained in the divisional calculation of nonredundant symmetric ternary numbers;

FIG. 30 is an illustration showing how to divide two digit binary numbers when divisor is positive and dividend is negative:

FIG. 31 is a conversion table to be used when HEN2 is converted to nonredundant symmetric ternary numbers and signed integers of two digit binary numbers are converted to nonredundant symmetric ternary numbers: and FIG. 32 is a conversion table to be used when nonredundant symmetric ternary numbers is converted to HEN2 and nonredundant symmetric ternary numbers are converted to signed integers of two digit binary numbers.

5. DETAILED DESCRIPTION OF THE INVENTION

The following is the detailed description of embodiments for a reproducible data conversion and/or compression method of a digital signals and data converter and a digital computer according to the invention, referring to attached drawings. But, this invention is not limited to the above embodiments.

Figure 1:
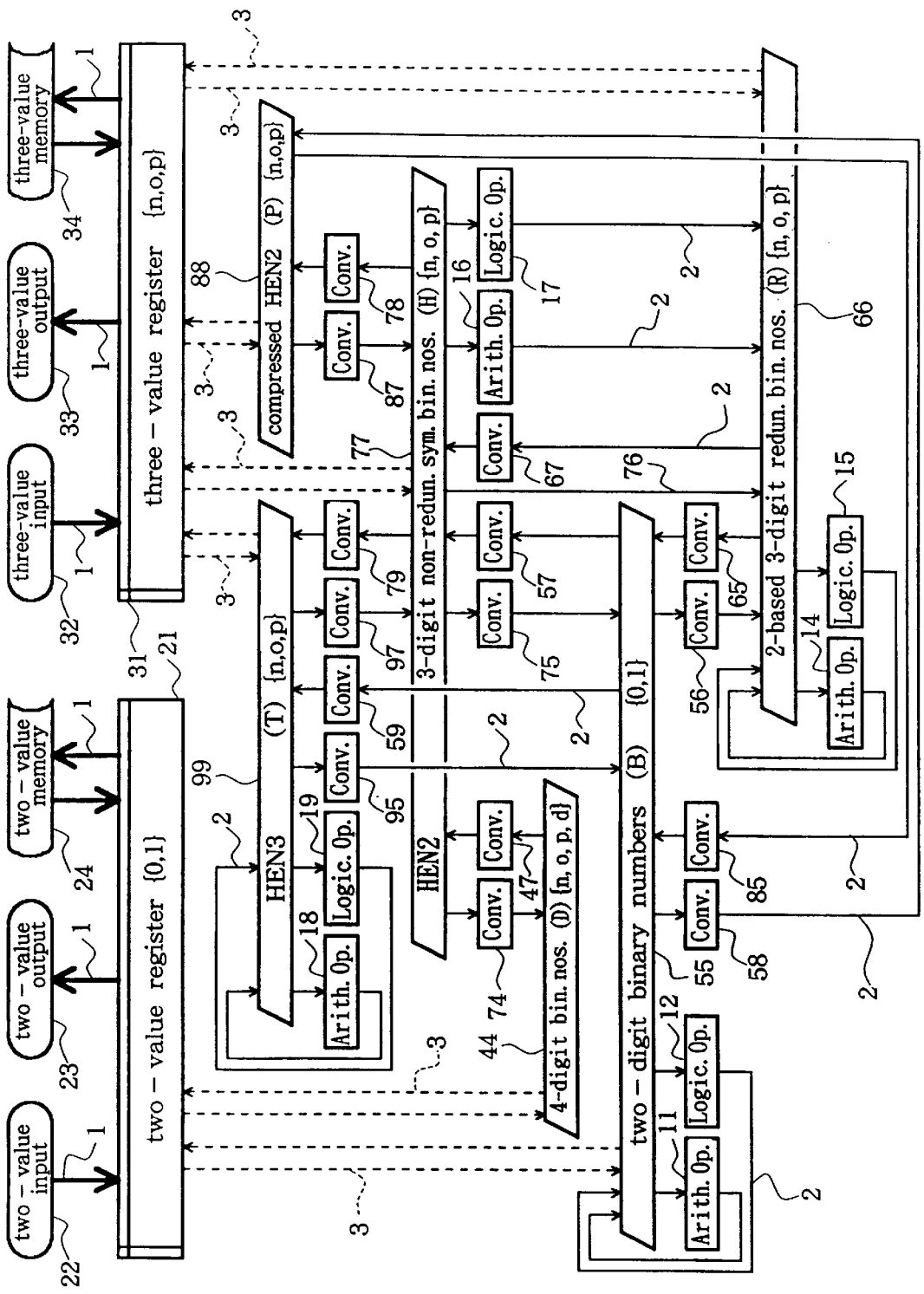
FIG. 1 is the general block diagram of the embodiment of this invention.

FIG. 1 is the general block diagram of an embodiment of the data signals and data conversion method according to the invention. The bold arrows (1) in the diagram show the direction of signal transfer. The plain arrows (2) show a direction in which a type of signal advances (for copying in other section) through conversion to another type of signal, an orientation toward which the original meaning of a signal should be changed, or a relational direction between a number to be processed and the operational result, so that these plain arrows do not always mean actual transfer of signals through lines. Boxes (such as 21 and 31) do not always mean devices and so on. When a device functions another way or with limitation to time and location, another box may be used.

Two-value register (21) functions to handle a two digit signal {0, 1}, either of which is used to express one digit signal. The two-value register (21) inputs a two digit signal from a two-value input (22) via storage medium or communication means, and outputs a two digit signal from a two-value output (23) via storage medium or communication means, while stores a two digit signal to two-value memory (24) and gets a two digit signal from two-value memory (24) as required.

Three-value register (31) functions to handle a three digit signal {n, o, p} meaning value {−1, 0, 1}, either of which is used to express one digit signal. The three-value register (31) inputs a three digit signal from a three-value input (32) via storage medium or communication means, and outputs a three digit signal from a three-value output (33) via storage medium or communication means, while stores a three digit signal to three-value memory (34) and gets a three digit signal from three-value memory (34) as required.

In this connection, as described above, it is not necessary to install different types of devices for the two-value register (21) and the three-value register (31). For example, when a register handles two-digit signal {0, 1}, such numbers may be divided two bits by two bits into "11, 00, 01" which are used to make three-digit signals {−1, 0, 1}, while when a device handles three-digit signal {n, o, p}, only "o, p" may be used to make two-digit signals {0, 1}. This relation can be applied also for handling combinations of "two-digit input (22) and three-digit input (32)", "two-digit output (23) and three-digit output (33)", and "two-digit memory (24) and three-digit memory (34)". In FIG. 1, depending upon what type of signals are to be handled, different boxes are shown separately.

Data to be stored in a two-value register (21) are either one of following two: two-digit binary numbers (55) whose each digit is 0 or 1 (often designated as "B" in the drawings) and compressed four-digit binary numbers (44) whose each digit is d, n, o, or p using 2 bit signals {10, 11, 00, 01} (often designated as "D" in the drawings). On the other hand, data to be stored in a three-value register (31) are either one of following four: two-based three digit redundant binary numbers (66) whose each digit is n, o or p (often designated as "R" in the drawings), HEN2 (77) corresponding to a subset of the three digit redundant binary numbers (66) which is assembled by extracting only a combination of the numbers, at least whose either one of two adjacent digits is a signal "o" indicating zero (often designated as "H" in the drawings), compressed HEN2 (88), in which the number of digits (in the HEN2) including signal "o" indicating zero is reduced (often designated as "P" in the drawings); more particularly, when zero-digit "o" signal interplaced between two non-zero digits {n, p} is only of one digit, at least zero digit signals having only one digit are omitted (compacted) to reduce the number of digits, and 3-based nonredundant symmetry ternary numbers or HEN3 (99) in which either one of {n, o, p} is used for signals of each digit (often designated as "T" in the drawings).

In FIG. 1, conversion, arithmetic operation and logic operation between respective data are shown. Every operation is not always necessary, and when some of them are not relevant, those may be by-passed for further processing. For example, a construction of data which has nothing to do with HEN3 (99) or compressed four digit binary numbers (44) can be treated. HEN 2 (77) is a variation of the three digit redundant binary number (66); in which only combinations of such signals as at least one of two adjacent digits expresses zero "o" is selected out from the original binary numbers (66). In short, HEN2 (77) is equivalent to a subset to be completely included in the original binary numbers (66), thus eliminating the need for making conversion when handling HEN2 as the number (66). This is indicated by only a piece of arrow (76). Broken arrows (3) are drawn between two-value register (21) and two digit binary numbers (55) or compressed four digit binary numbers (44), between three-value register (31) and three digit redundant binary numbers (66) or HEN2 (77), or compressed HEN2 (88), or HEN3 (99). The broken arrows (3) directly show only which type of numbers are stored on respective registers, so that there is no conversion or transfer of numbers between them.

On the two-value register (21), integer type of data shown in FIG. 2 and real number type of data shown in FIG. 3 are placed. In the case of this embodiment, as shown in FIG. 2, there are three integer types of data structures; 16 bit fixed integer with sign (25) (often designated as "s_int" in the drawings), 16 bit fixed integer with no sign (26) (often designated as "u_int" in the drawings), and 8 bit fixed exponent with sign (27) (often designated as "exp" in the drawings), where bit numbers to be used are not limited to these 16 and 8. These data structures are similar to those used in the electronic computer according to the prior art, thereby neglecting further description. As shown in FIG. 3, in this embodiment, real number type of data structures have two following types; (1) 64 bit fixed length fixed point mantissa with exponent (28) (often designated as "float" in the drawings), and 128 bit fixed length fixed point fraction with exponent (29) (often designated as "fract" in the drawings). Details will be described later.

Figure 5:
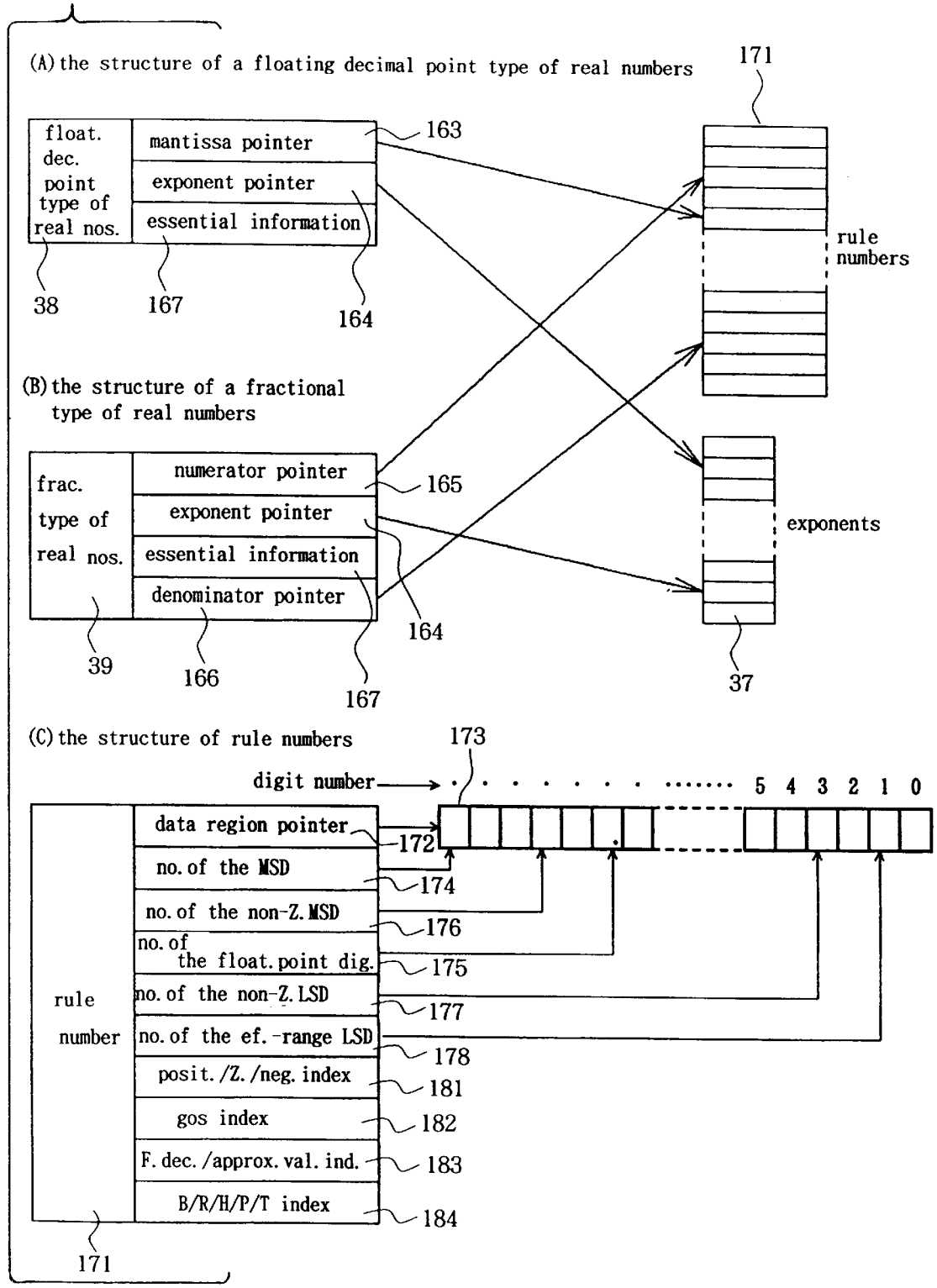
FIG. 5 is an illustration showing a real number type of data structure to be placed in the three-digit register.

On the three-value register (31), integer types of data shown in FIG. 4 and a real number type of data shown in FIG. 5 are placed. In the case of this embodiment, there are two integer types of three digit symmetrical binary data structures; 17 digit fixed integers (35) (often designated as "int" in the drawings), and 8 digit fixed exponents (37) (often designated as "exp" in the drawings). The number of digits are not limited to 17 and 8. There are two real number types of data structures; a floating decimal point type of real numbers (38) and a fractional type of real numbers (39), both of which take an indirect address system. Details will be described later.

First of all, as shown in FIGS. 6 and 7, when integers are represented by the two notations, this inventor discovered that the integers never failed to uniquely correspond to one another. Now, detailed description is presented here as follows:

There are three digit redundant binary numbers (66) which can represent one or more digits of numerical values by using either one of three signals {n, o, p} representing 2-based numerical values {−1, 0, 1} in each digit. The numerical values of the three digit redundant binary numbers (66) may be determined, when signals in respective digits are raised to the 2nd power to obtain their sum, but a significant redundancy of the binary system has been identified as compared to possible different notations. According to the three digit redundant binary numbers (66), for example, any one of p, pn, pnn, pnnn, pnnnn, pnnnnn and so on can rightly represent an integer 1, thus lacking in uniqueness.

Here, let us consider a specific binary number (77) called "HEN2" by this inventor: In the three digit redundant binary numbers (66), there are signals so that at least one of two adjacent digits of the numbers is a signal "o" expressing zero. HEN2 (77) is a subset to be completely included in the three digit redundant binary numbers (66), that is, an extraction assembly of only such combinations of the signals, thereby obtaining nonredundancy, so that a possible arrangement of respective digits of signals or characters representing an integer is uniquely limited. Its examples are shown in FIGS. 6 and 7: Since HEN2 (77) is a subset of the three digit redundant binary numbers (66), weighting of 2 to the power to signals in respective digits and summation of the resultants can indicate the numerical value of the binary number. As shown in FIG. 6, when a two digit binary number (55) is a 16 bit integer with sign (25), there is a unique relation between decimal numbers (10), two digit binary numbers (55), HEN2 (77), compressed HEN2 (88) and compressed four digit binary numbers (44); only the notations shown in FIG. 6 are allowed for representing the integers shown in FIG. 6 by way of respective notations. But, here, a compression method to be used for making the compressed HEN2 (88) and the compressed four digit binary numbers (44) is limited to a method which can maintain a unique relation with HEN2 (77). Detailed description will be made later.

In this connection, according to the example shown in FIG. 6, an integer with sign (25) of two digit binary number (55) is of 16 bit fixed type, and the most significant 15th bit is sign bit, so that even a decimal number of less digits cannot be abbreviated. On the contrary, HEN2 (77), compressed HEN2 (88) and compressed four digit binary numbers (44) are negative when non-zero most significant digit is n, while positive when non-zero most significant digit is p, so that more significant digits than the non-zero most significant digit can be neglected, or can be thought to be filled up with signals "o" indicating zero. Therefore, as described previously, for HEN2 (77) and compressed HEN2 (88) in which 2 bits are assigned to {n, o, p}, it may be allowed that signals of "10" so far unused are used to more significant digits than non-zero most significant digit, but following description will assume they are vacant. When a decimal number is zero, the corresponding notations by the other systems (77) and (88) are thought to be only 1 digit of signal "o" and vacant higher order digits, so that the only 1 digit of signal "o" can be regarded as signals representing the sign of numerals in the same way as the non-zero most significant digit. The concept of these vacant digits can be applied to the three digit redundant binary numbers (66) and the nonredundant symmetric ternary numbers (99).

As shown in FIG. 6, when a two digit binary number (55) of a 16 bit signed integer (25) is converted to HEN2 (77), the maximum number of digits, irrespective of sign (plus or minus), is 16. On the other hand, as shown in FIG. 7, when a two digit binary number (55) of a 16 bit unsigned integer (26) is converted to HEN2 (77), there may be a case when the maximum number of digits is 17. Accordingly, as shown in FIG. 4, 17 digits are used for integers to be placed on a three-valued register (31). But, when decimal numbers of 17 digits is converted to two digit binary number (55), the conversion may naturally be subject to the limitation of the number of digits, so that all of HEN2 (77) expressed by 17 digits may not always be converted to a two digit binary number (55) indicating the same numerical value. Therefore, like digital video signals, there are data not discriminating positive or negative of numerical value, or with no necessity of such discrimination, which should be basically handled as unsigned integers (26). When such data are converted from two digit binary numbers (55) to HEN2 (77) to compress and reproduce data volume (to be referred to later), they can be converted regarding them as signed integers (25) never increasing the number of digits.

To make conversion (78) from HEN2 (77) to compressed HEN2 (88) and conversion (87) from compressed HEN2 (88) to HEN2 (77), compression and reproduction are made using a reference table, depending upon the location of signals "o" indicating zero and on the number of continual digits of "o", but this method is not limited to the above, and unique relation is not essential. More particularly, in this case, only one digit "o" placed between non-zero digit indicating either one of "p, n" and other non-zero digits is cut off, so that with compressed HEN2 (88), non-zero digits are arranged side by side. This cut-off compresses or compacts the number of digits of the data by one digit. Next, "oo" (that is, 2 continual digits of "o") remains as it is also in compressed HEN2 (88), irrespective of the location of the digits, and only one digit "o" at the end of decimal numbers, that is when with an integer, the first digit is "o" and the second digit is non-zero, remains intact also in compressed HEN2 (88). Therefore, in this case, as with this part, even compressed HEN2 (88) never reduces the number of digits. When more than or equal to three digits of signals "o" indicating zero continue, the continual signals "o" irrespective of location of these digits, are coded as shown in a column of compressed HEN2 (88) in FIG. 8, and a combination of non-zero digits placed between two pieces of "o" is uniquely substituted for the continual signals "o". FIG. 8 shows a reference table to be used when the maximum number of digits in HEN2 (77) is 20. Because the ternary numbers (obtained when 1 and 2 are substituted for n and p, and each digit is weighted by 3 to the power) are arranged in an increasing sequence, HEN2 having larger numbers of digits also can be substituted in such a way as shown in FIG. 8.

Thus obtained are the notations of compressed HEN2 (88) shown in FIGS. 6 and 7, never having more than or equal to three continual digits of signal "o" indicating zero. When making conversion (87) for restoration from compressed HEN2 (88) to HEN2 (77), the number of "o"s included in one or more digits of compressed HEN2 (88) indicating one numeral value is to be counted. If odd, the least significant "o" is only the one digit "o" indicating the end of the numerical value. If even, and in the case of an even number of "o"s other than "o" indicating the end in the case of odd number, two "o"s are paired to one another, and then "o" continual digits are substituted for their pairs, against the reference table shown in FIG. 8. Finally, in the case of non-zero digits arranged side by side, one digit insertion of "o" among them will form a combination of signals "o" which show that at least one of two digits arranged side by side in any digit indicates zero, thus achieving a reproduction of HEN2 (77) before compression.

Figure 9:
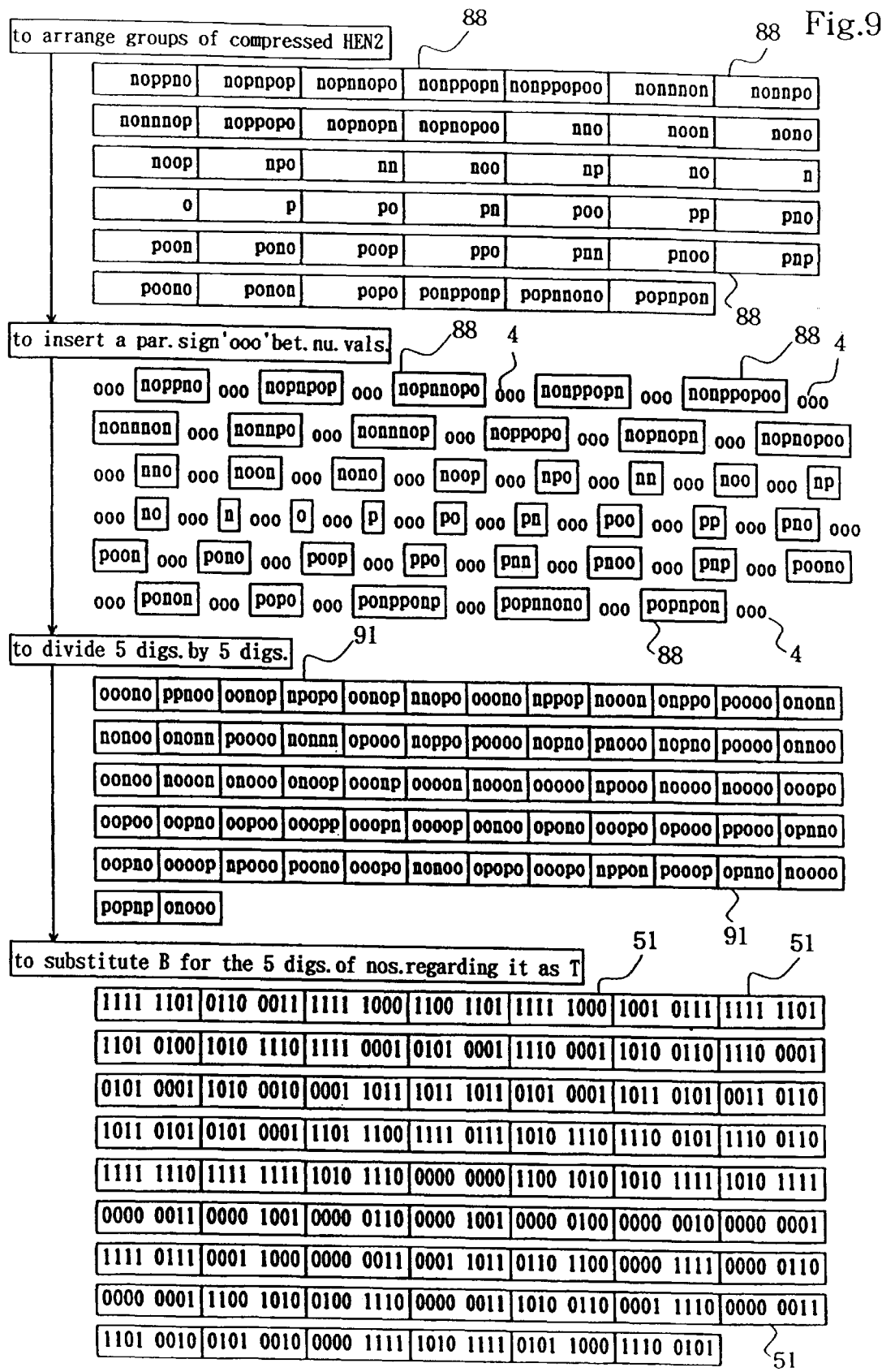
FIG. 9 is an illustration showing an example of nonpop compression process in which a numeric group of compressed HEN2 is converted to a cluster of numbers of two digit binary system, regarding the former as numbers of three digit ternary system.

FIG. 9 shows how to convert a plurality of compressed HEN2 (88) thus obtained to a cluster of two digit binary numbers: More particularly, a compression process of the whole number of digits is shown in FIG. 9, regarding the 41 pieces of integers shown in FIG. 6 as an associated train of figures. First of all, groups of compressed HEN2 (88) are arranged. As described above, with compressed HEN2 (88), three or more continual signals "o" indicating zero never appear, thus using 3 continual digits of "o" or "ooo" (4) as a partition sign between numerical values. Apart from the case where numerical value is zero, when vacant digits are excluded, the most significant digit of compressed HEN2 becomes non-zero digit. The digit number of individual numerical values may not be constant, but additional three digits "ooo" (4) is given at their numerical partition so as to divide 5 digits by 5 digits from higher order digit or lower order digit. Regarding the 5 digits of numbers {n, o, p} thus obtained as 3-based nonredundant symmetry ternary numbers (91), 3 to the power weighting of respective digits are summed up, then nonredundant symmetry ternary numbers (91) are obtained from nnnnn=−121 up to ppppp=121. Therefore, rather than making calculations of weighting and summation every time when nonredundant symmetry ternary numbers (91) is converted (95) to two digit binary numbers (51), it is easier and faster in the conversion to make substitution against the reference table shown in FIG. 10.

Thus obtained is a cluster of two digit binary numbers (51) shown in FIG. 9. Forty-one pieces of 16 bit integers shown in FIG. 6, that is, two digit binary numbers (55) of 82 bytes shown in FIG. 6 is compressed to two digit binary numbers of (51) of 62 bytes in FIG. 9 (called "nonpop compression" by this inventor). In this case, compressed HEN2 (88) added with a partition sign "ooo" (4) to the group of numerical values is divided off by 5 digits. Otherwise, its meaning is different depending upon the number of continual "o"s in the end, so that the whole number of digits before dividing by 5 digits is added as an essential information for the cluster of two digit binary numbers (51) (detailed description omitted here). In this connection, when dividing by 5 digits, it is better to divide by 5 digits from lower order digit at the end to compensate "o" to a portion of numerical number at higher order end, than to divide off by 5 digits from higher order digits. This way makes reproduction process easier.

This example hints that: The less the frequency using division signal "ooo" (4), the more the compression effectualized. In other words, like digital video signals, in the case when most signals use all of the bit numbers allotted to two digit binary number (55), regarding the two digit binary number (55) as one piece of numerical value with a large number of digits to make conversion and compression can reduce the number of division signs "ooo" (4).

A cluster of two digit binary numbers (51) thus obtained by compression can be sent to two-value memory (24) and two-value output circuit (23) along with the essential information, and fetched from external devices via two-value input circuit (22).

Reproduction of a cluster of this compressed two digit binary numbers (51), by keeping track of the backward sequence of the compression method so far described, can obtain the original HEN2 (77). More particularly, in the conversion (59) from two digit binary number (51) to HEN3 (91), first a cluster of two digit binary numbers (51) is broken down 8 bits by 8 bits as shown in FIG. 9, and then HEN3 (91) divided 5 digits by 5 digits is made against the reference table in FIG. 10. Then, the partitions on the HEN3 (91) are removed just to continually arrange a train of digits {n, o, p}. Only the range of digit numbers given as essential information is selected for further processing to search for where more than or equal to 3 digits of signals "o" are lined up.

When the lined up number of digits is three, the portion indicates a partition of compressed HEN2 (88), while, if four, the portion indicates the partition of compressed HEN2 (88) and "o" at the end of higher order numerical values. If five, the portion indicates the partition of compressed HEN2 (88) and "oo" at the end of higher order numerical values. If seven, one piece of zero value compressed HEN2 (88) and two pieces of partition "ooo" (4) are placed between two pieces of compressed HEN2 (88), thus indicating that seven digits of "o" are side by side in total. If equal to or more than eight, sequentially apply the number of digits so far described from the low order side, and substitute one piece of zero value compressed HEN2 (88) and one piece of partition sign "ooo" (4) for 4 digits of "oooo", and finally count the number of remaining lined-up "o"s. In this way, a cluster of two digit binary numbers (51) can be converted to a numerical group of compressed HEN2 (88). It goes without saying that, to convert the numerical group of compressed HEN2 (88) thus obtained to a numerical group of HEN2 (77), the conversion (87) so far described can be applied to individual numerical values.

As described above, according to the compression method shown in FIG. 9, when partition signs "ooo" (4) are used frequently, the number of digits to be reduced is ineffectively a few. Therefore, when the number of digits of individual compressed HEN2 (88) is less, a more effective compression method has been devised as shown in FIG. 11: Similarly to FIG. 9, first the numerical groups of compressed HEN2 (88) are lined up. As a partition between numerical values, one digit of sign "k" (5) is inserted. Although the number of digits of individual numerical values are variable, one digit of "k" (5) is added at the partition of these numerical values. Then, the number series are divided 4 digits by 4 digits from the higher order digit or the lower order digit. Among the four value signals {k, n, o, p} obtained here, four digit numbers (81) whose one digit is either one of the signals are converted (85) against a conversion table in FIG. 12, thus obtaining a cluster of two digit binary numbers (52) (we call this conversion as "knop compression"). In this connection, for the digits of fractional figure at the end which may appear at the conversion, "k", "kk" or "kkk" (5) are filled up (82) to supplement, but way of supplementation is not limited to the above. In this case, four digit numbers (81) of four value signals divided 4 digits by 4 digits are used to compare with FIG. 9. But in the course of conversion, it is not necessary to indicate clearly and it never requires four value register. In short, it goes without saying that: While reading the numerical groups of compressed HEN2 (88), partitions "k" (5) are inserted between them. And, then, one digit should be converted into 2 bits by 2 bits from the higher order digits or the lower order digits. This applies also to the conversion in FIG. 9.

In order to convert (58) a cluster of two digit binary numbers (52) to compressed HEN2 (88), and to reproduce the compressed HEN2 (88) to HEN2 (77), as with the above description in FIG. 9, the conversion (85) shown in FIG. 11 should be made in the backward sequence to group the numerical numbers of compressed HEN2 (88). And, then, the numerical groups should be converted (87) to numerical groups of HEN2 (77). But, as compared to the case in FIG. 9, it is very easy to identify the partition signs "k" (5) between numerical values, and searching of the number of continual "o"s (at most two) should be made at the stage of conversion from compressed HEN2 (88) to HEN2 (77).

Either examples of compression methods shown in FIGS. 9 and 11 shows that HEN2 (77) is converted to compressed HEN2 (88) which is further converted to two digit binary numbers (51 or 52). As apparent in the reference table shown in FIG. 8, even with compressed HEN2 (88), the number of digits is not reduced at the portion, if the number of "o" continual digits are two or three. But, similarly to the said knop compression, when two bits are assigned to one digit to use them as four value, signals other than "n, o, p" may be used to reduce the number of "o" continual digits. As one of the examples, a compression method which goes through compressed four digit binary numbers (44) as a compression type of HEN2 (77) is shown as follows:

Either one of four value signals {n, o, p, d} is used as one digit signal. A relation between the number of "o" continual digits in HEN2 (77) and the arrangement of signals of compressed four digit binary numbers (44) is specified as shown in FIG. 8. In short, since both "o" and "d" are signals indicating zero digit, one or more pieces of the two types of signals are arranged side by side to be coded. Further, inclusive of pair of "od" and "d" or "od" and "do", the continuity of "o" in HEN2 (77) is shown using the combination of four value signals "n, o, p, d" in the range of two or more digits intercepted by these pairs, so that the relation with continual number of digits is uniquely associated as described in FIG. 8. In the reference table shown in FIG. 8, the number of "o" continual digits is specified up to 20, but, for more digits, an unique reference table may be formulated. Compression examples in which HEN2 (77) is converted (74) to compressed four digit binary numbers (44) using this table are placed together in FIGS. 6 and 7. This example specified the relation between the number of "o" continual digits in HEN2 (77) and compressed four digit binary numbers (44) as shown in FIG. 8, but this is not limited to the above.

Figure 13:
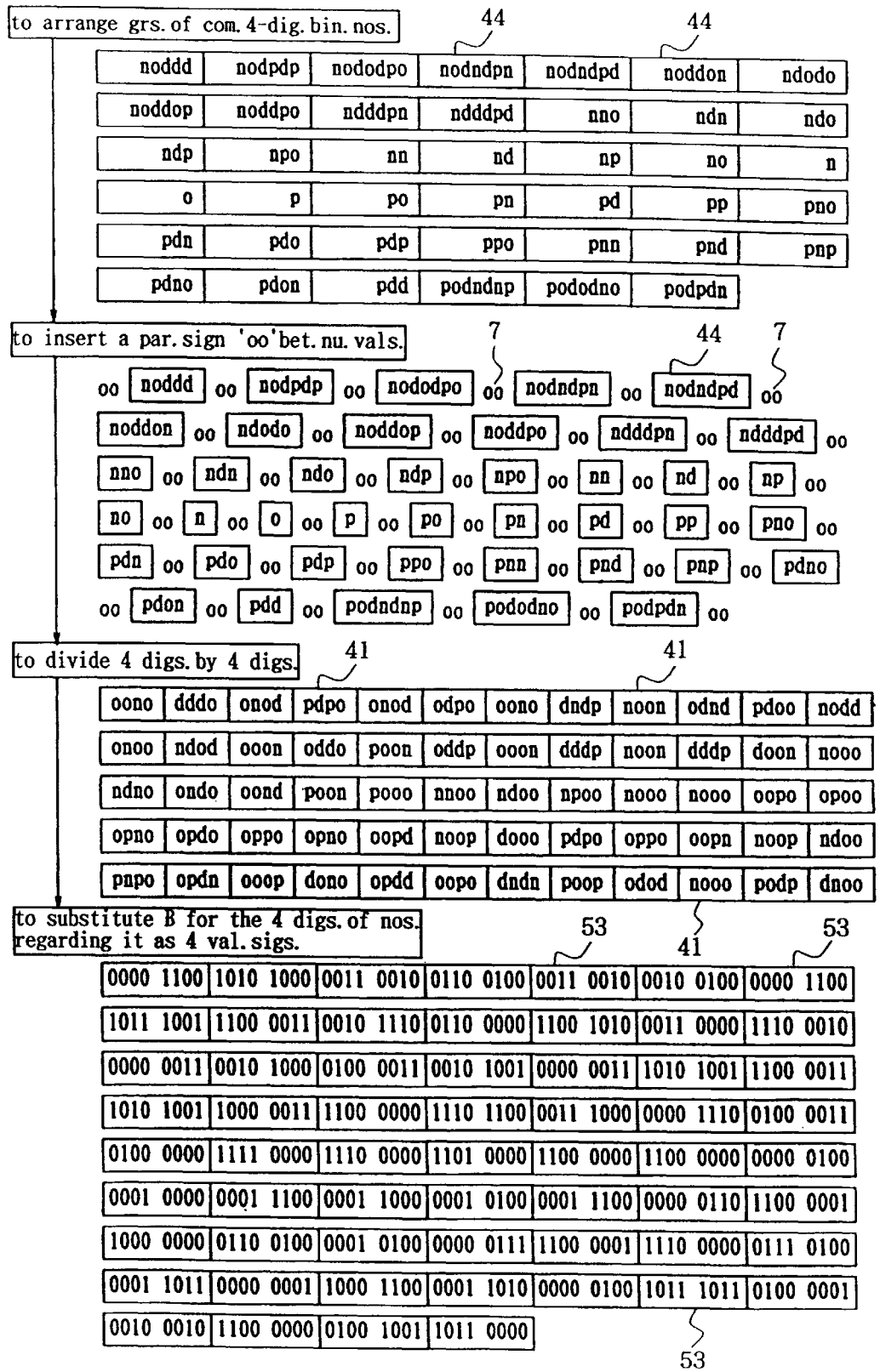
FIG. 13 is an illustration showing examples of pond compression process which converts four digit signals, which were made by arranging the numerical groups of compressed four digit binary numbers, inserting divisional sign (oo) between numerals, and dividing them for every four digits, to a cluster of two digit binary number.
Figure 14:
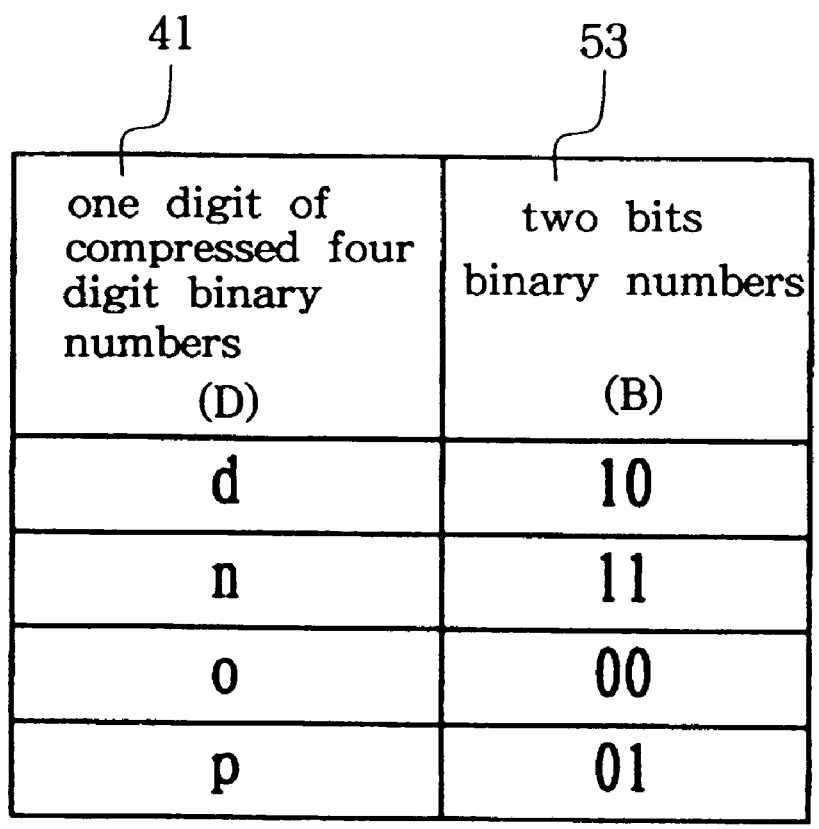
FIG. 14 is a conversion table showing the correspondence between one digit of the compressed four digit binary numbers and two bits of two digit binary numbers.

These examples show that: Since compressed four digit binary numbers (44) do not use two-digit continual sign "oo", the sign "oo" is used as a sign "oo" (7) showing a partition between two numeral values. When we are substituting two digit binary numbers (53) for compressed four digit binary numbers (44) (both numbers are handled in a two-value register (21)), partition sign "oo" is inserted between numerical values, only the boundary is moved. This pattern is shown in FIG. 13. The example of compression process shown in FIG. 13, similarly to the two examples shown in FIGS. 9 and 11, shows a compression process of the whole number of digits, where 41 pieces of integers shown in FIG. 6 are regarded as a package. First, the numerical groups of compressed four digit binary numbers (44) shown in FIG. 6 are lined up. Then, as described previously, excepting for the case where the numerical value of a compressed four digit binary number (44) is zero, the most significant digit becomes non-zero digit. The number of digits of individual numerical values may not be same. Two-digit signs "oo" (7) are added to the partitions of these numerical values to divide the resultant four digits by four digits from the higher order digits or the lower order digits. The trains of four digits {n, o, p, d} (41) thus obtained are converted to two digit binary numbers (53) against the conversion table shown in FIG. 14, thus obtaining the binary numbers of 60 bytes (we call this as "pond compression").

To reproduce a cluster of two digit binary numbers (53) thus obtained to the original HEN2 (77), the procedure shown in FIG. 13 can be kept track adversely. More specifically, like the reproduction process of nonpop compression shown in FIG. 9, the locations of the partition signs "oo" (7) are searched for, to substitute compressed four digit binary numbers (44) of one or more digits for the two digit binary numbers (53). At this time, "o" may never continue in numerical values of compressed four digit binary numbers (44), but, when there is "o" at the end of numerical value, the partition sign "oo" (7) at the end looks like 3 digits of "ooo", or there may be a chance where five or more "o" are lined up, when numerical values of zero are included. When individual compressed four digit binary numbers (44) are being converted (47) to HEN2 (77) after the previous course of division into two or more compressed four digit binary numbers (44), substitution by "o" continued digits is made from the higher order digits against the conversion table shown in FIG. 8. When non-zero digits line up at the end, one digit "o" is inserted between these non-zero digits, to obtain HEN2 (77) excluding "d".

In these examples, 82 bytes of two digit binary numbers (55) as shown in FIG. 6 are compressed into 62 bytes of two digit binary numbers (51) as shown in FIG. 9, 57 bytes of two digit binary numbers (52) as shown in FIG. 11, and 60 bytes of two digit binary numbers (53) as shown in FIG. 13. As these examples show, when converting (57) two digit binary numbers (55) to uniquely corresponding HEN2 (77) for compression, the compression degree of the sign substituting zero digit of HEN2 (77) and the sign for partition of numerical values is different depending upon their frequency, so that the best compression method can be selected depending on the nature of numerical data. Further, in the cases of FIGS. 9 and 11, those numbers go through the same compression HEN2 (88). Therefore, the number of digits to be reduced will be different depending on the total number of digits of numerical value groups of compressed HEN2 (88) and the number of partitions decided by the number of numerical value groups, so that preparation for optional selection of both compression methods can allow the best method to be selected, case by case. Further, the selected compression method should be noted in the essential information, so as to have a best suited conversion by knowing the information for right reproduction.

To make compression of two digit binary numbers (55) to compressed two digit binary numbers (51, 52 or 53) and in addition to reduce data volume appear to be contradictory. In particular, both of the methods exemplified in FIGS. 11 and 13 require not only assignment of two bits to one digit at non-zero digits, but also partition sign between numerical values. However, as shown by actual examples in FIGS. 9, 11 and 13, they showed real reduction of the total number of bytes. This is caused by exclusion of possible useless portions included in original two digit binary numbers (55), which are not always expectable. For example, even if intending to compress all of the two digit binary numbers (51) in FIG. 10, assigned number of bits has been used evenly without exception, thereby making compression effect unexpectable, thus possibly resulting in more number of bits inadvertently. After all, a compression method best suitable for the content of data must be selected, but no compression might be another option.

Figure 15:
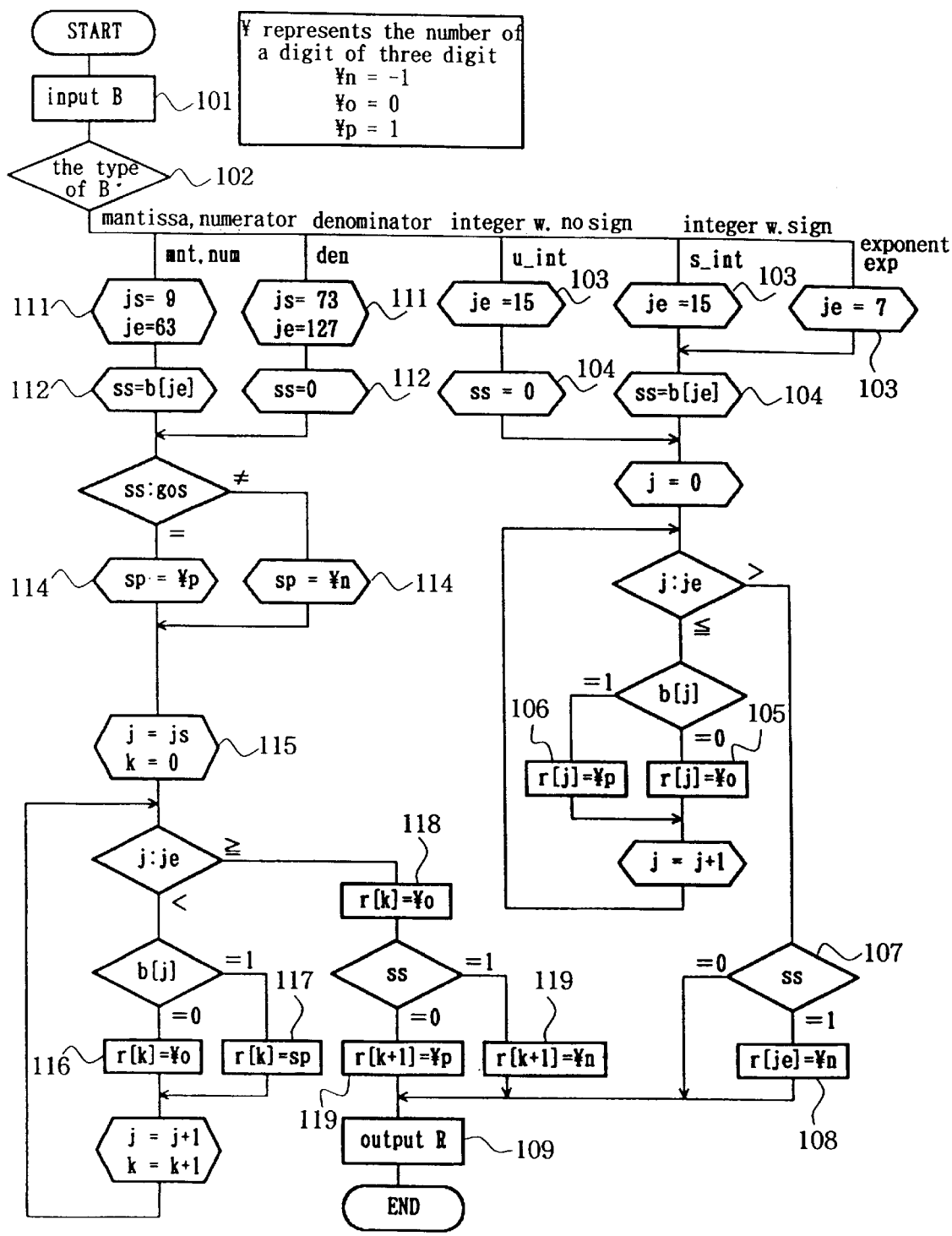
FIG. 15 is a flow chart showing a conversion process from two digit binary number to three digit redundant binary number.

Next, detailed description of conversions (56, 57, 65, 67 and 75) among two digit binary numbers (55), three digit redundant binary numbers (66) and HEN2 (77) will be made using flow charts:

FIG. 15 is a flow chart showing how to convert (56) from two digit binary numbers (55) to three digit redundant binary numbers (66): In this chart, the integer and the real number type both are drawn. First, we make the description for the integer type, about the real type will describe after. When receiving (101) two digit binary numbers (55) to be converted, which one of the types shown in FIGS. 2 and 3 concerns is to be identified (102). In the case of integer type in FIG. 2, the number of the most significant bit is set (103) to je, and positive or negative identification sign ss is set (104). Then, sequentially from the 0 bit, if bit of two digit binary numbers (55) is "0", "o" is placed to the corresponding digit of three digit redundant binary numbers (66) at Step (105), and if bit "1", "p" is placed to the corresponding digit of three digit redundant binary numbers (66) at Step (106). at After conversions up to the je-th bit have been finished to complete the loop, in the case where ss is identified (at Step (107)) to have negative sign, the je-th digit of three digit redundant binary numbers (66) is changed to "n" (at Step (108)), thus obtaining the three digit redundant binary numbers (66) corresponding to the received (101) two digit binary numbers (55) (at Step (109)). This flow chart shows the conversion process (56) of two digit binary numbers (55) to three digit redundant binary numbers (66) shown in FIG. 1. In this connection, the original two digit binary numbers (55) are to be replaced, but never disappear.

Figure 16:
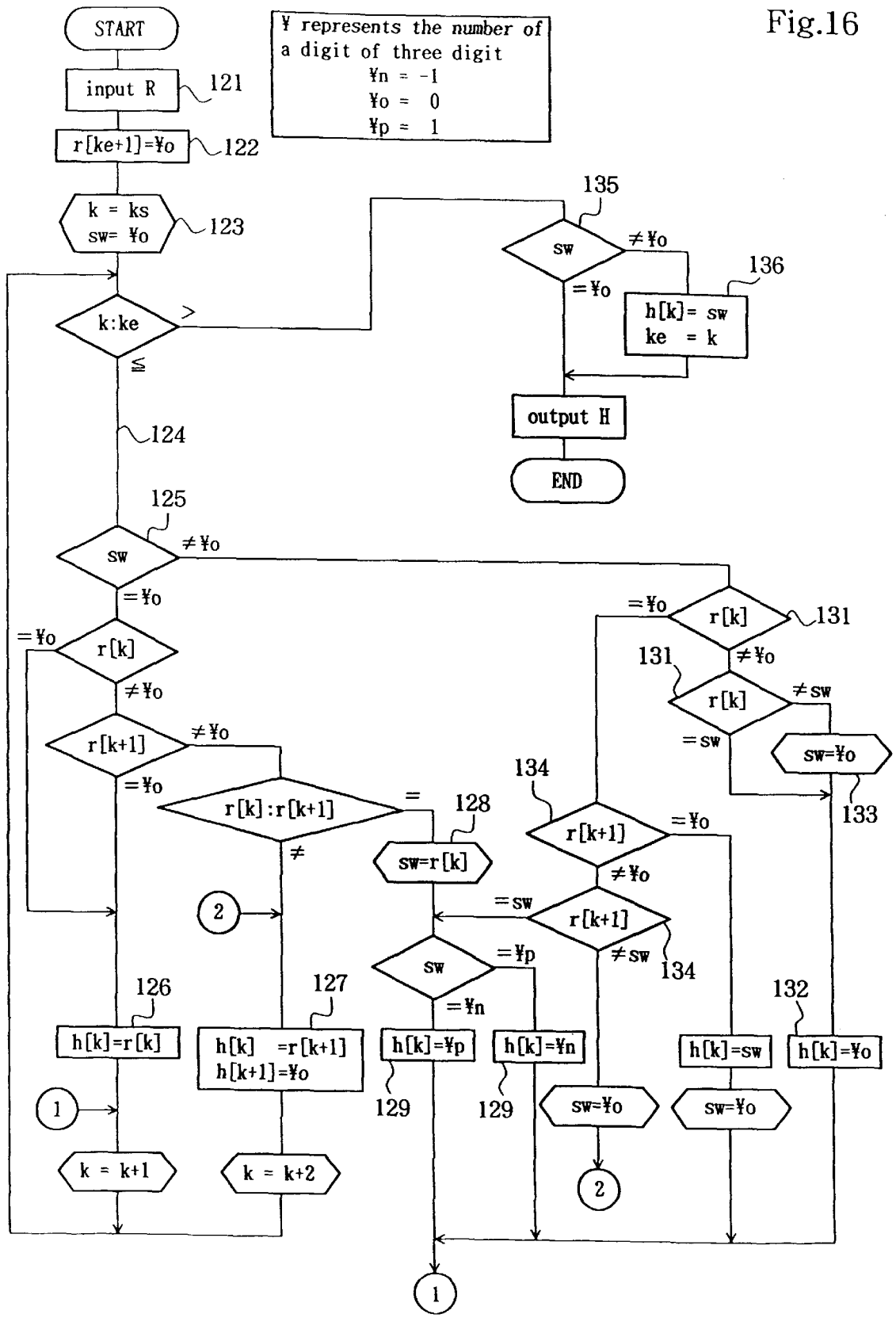
FIG. 16 is a flow chart showing a conversion process from three digit redundant binary number to HEN2.

FIG. 16 is a flow chart showing a conversion (here, we call this conversion as "normalization") of three digit redundant binary numbers (66) to HEN2 (77). Before entering into the detailed description of this kind of conversion or normalization, first, the description of the rule or concept of the normalization will be made: FIG. 17 shows a comparison between HEN2 (77) and three digit redundant binary numbers (66) when expressing same numerical numbers. Here, it should be noted that when expressing a numerical value using three digit redundant binary number (66), there may be many expressions applicable in which there are many combinations of every digit signals or characters. This comparison table is nothing but to describe only a few examples. Among the selected three digit redundant binary numbers (66) in the table, the one equivalent to the subset equal to HEN2 (77) is boxed (6) for discrimination. To give an easy understanding of the numerical values, the corresponding decimal numbers (10) are also written. Ye found out a possible or promising normalization rule from the table for the case when non-zero digits are lined up side by side. The following is a verification whether this rule can be a general rule for the normalization from three digit redundant binary numbers (66) to HEN2 (77):

First, with different non-zero digits at adjacent digits, that is when they are pn and np, they can be replaced by op and on. Therefore, in this case, higher order digit signal is transferred to lower order digit, and the higher order digit signal is compensated by a zero signal "o". Next, let us consider the case when a plurality of the same non-zero digit signals are lined up side by side. pp can be substituted by pon, ppp is by poon and pppp is by pooon. More particularly when a plurality of the same non-zero digit signals are lined up side by side, a directly higher digit than the most significant digit in the range where the same non-zero digits are lined up is substitute by the same non-zero digit signal, and the least significant digit in the range is substituted by a different non-zero signal (that is, p is changed to n and n is changes to p) and then the digits between them are changed to "o". This rule applies also when non-zero digit signal is "n". This means p can be read n and n can be read p, so that the aforementioned general rule holds good consistently. But, when the directly higher digit than the most significant digit in the range where the same non-zero digits are lined up is different non-zero digit, "n" and "p" cancel out each other, thus resulting in the digit "o". For example, oppp is changed to poon. This can be thought that, when thinking nppp equals to n and ppp separately, nppp is changed to nooo and poon, thereby canceling out n and p, thus resulting in ooon. Such conversion or normalization can be made sequentially from lower order digits toward higher order, so that in the case of integers, the first digit can be the starting point.

FIG. 16 is a flow chart showing how to execute the normalization (67) rule. When receiving a three digit redundant binary number (66) to be normalized at Step (121), the number is followed by essential information which tells that the most significant digit number is ke and the least is ks. In this connection, in the case of normalization of the integer type shown in FIG. 4, ks is changed to 0. Since ke is the number of the most significant digit in the data structure, if integer (35), ke is changed to 16, and if exponent (37), to 7. With the three value register (31), the (ke+1)-th digit also is assumed to be able to be used in this normalization. Since in the normalization (67) a digit for which attention is paid and two directly higher order digits should be compared with each other, a vacant signal is placed (Step 122) at the (ke+1)-th digit of three digit redundant binary number (66). The number of the least significant digit ks is changed to k, and "o" is set to sw as zero digit signal at the initial condition (Step 123). In the loop (Step 124), values ks to ke are placed to k, so that the k-th digit becomes a digit to be marked. In this normalization, since sw has a content which is handled when treatment is made for the directly preceding (k−1)-th digit, branching is made depending on the content of sw (Step 125). (A) In the case when sw is the same zero digit signal "o" as the initial condition, if either the marked k-th digit or two digits at higher order (k+1)-th digits is zero digit "o", the marked k-th digit is transferred as it is (Step 126), and if both digits are non-zero digits and different from each other, the (k+1)-th digit of signal is transferred to the marked kth digit, the (k+1)-th digit is changed to zero signal "o", thus resulting in a concurrent treatment of two digits (Step 127).

(B) When sw is zero digit signal "o", and both of the marked k-th digit and the two directly higher order (k+1)-th digits are the same signal and non-zero digits, since it corresponds to the least significant digit position in the range in which same non-zero digits are lined up, the digit signal is placed to sw (Step 128) and different non-zero digit signal is placed to the marked k-th digit (Step 129).

When sw has a non-zero digit signal at the start of the loop (Step 125), branching is made while comparing with the marked digit (Step 131). When sw is the same as the marked k-th digit, because they are in the course of line up of the same non-zero digit signals, zero signal "o" is placed (Step 132), while when the marked k-th digit is non-zero digit and different from sw, because of cancellation taking place as described previously, sw is returned to the same zero signal "o" as the initial condition (Step 133), and zero signal "o" is placed to the marked k-th digit in HEN2 (77) (Step 132). When sw has non-zero signal, and the marked k-th digit is zero digit, since it is directly higher order "o" digit than the most significant digit in the lineup of the same signals as non-zero digit signal which sw has, branching is made depending on the content of the directly higher order (k+1)-th digit than the marked k-th digit (Step 134).

In this way, after a loop up to ke digit has been completed, since there may be carry digit when sw has non-zero digit (Step 135), sw signal is transferred to the (ke+1)-th signal and one is added to ke (Step 136). In this case, the number of the non-zero most significant digit of three digit redundant binary number (66) may not vary, but it means that the number of the non-zero most significant digit of HEN2 (77) becomes one digit higher order side than that. This flow chart can be applied not only to integer type, but also to a mantissa part of floating decimal point type and normalization (67) of numerator and denominator. In this connection, in this normalization, some of the numbers of non-zero most significant digit of HEN2 (77) may move toward higher order than three digit redundant binary number (66). Such case is described in the flow chart, but some of them may move toward lower order side. For this case, the number of the non-zero most significant digit at the time should be always kept, by holding while updating the then number of the digit when non-zero digit is transferred. Otherwise, after the normalization has been finished, non-zero digits should be searched toward lower order, starting from the ke-th digit. This process is omitted in the flow chart.

Figure 18:
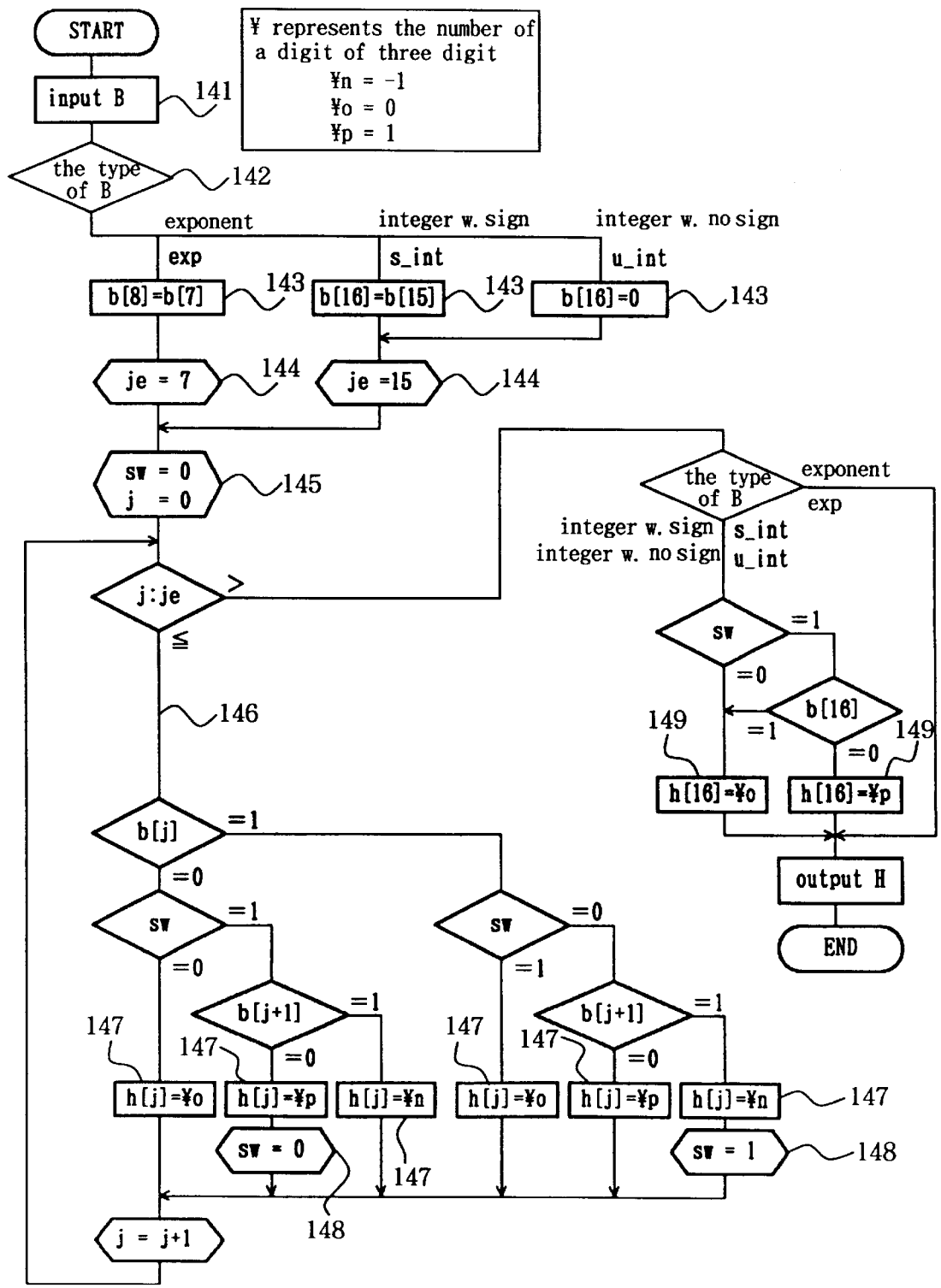
FIG. 18 is a flow chart showing a conversion process from two digit binary number to HEN2.

FIG. 18 is a flow chart showing a conversion (57) of two digit binary number (55) to HEN2 (77): This conversion (57) may be completed by making the conversion (56) and the normalization (67) successively, but this flow chart shows a simultaneous treatment of both the conversion (56) and the normalization (67). This conversion (57) shown in this flow chart applies to integer type of data. In this case also, treatment is made looking both of the marked bit and directly higher order bit, so that, in the two-value register (21), the bit number shown in FIG. 2 is added to one higher side, and the obtained bits are also assumed to allow the use for this conversion.

When receiving (at Step 141) two digit binary number (55) to be converted, identification (Step 142) is made for which type of the numbers shown in FIG. 2 is aimed at, and then one bit added to higher order side is set (Step 143), the number of the most significant bit is set to je (Step 144), and finally sw and j are set to the initial condition (Step 145). When proceeding into loop (Step 146), depending upon combination of the marked j-th bit, the next (j+1)-th bit and carry digit information that sw holds, as shown in FIG. 18, either signal {n, o, p} is placed to the j-th digit of HEN2 (77) (Step 147), and sw is changed as required (Step 148). After the conversion up to the je-th bit is finished to complete the loop, in the case of 16 bit integer, either signal {p, o} is placed also to the 16th digit of HEN2 integer (35) using the carry digit information which sw is holding (Step 149), thus finishing the conversion. The conversion shown in FIG. 18 corresponds to the case of fixed integer type, which does not search for the number of the non-zero most significant digit after conversion, but, when the number of the digit is required, the following must be done: to update and hold the number of the digit when transferring non-zero digit, and always to hold the number of the non-zero most significant digit at that time, or after the conversion, to identify whether there is non-zero digit from the higher order digit so as to obtain the number of the non-zero digit found first.

Figure 19:
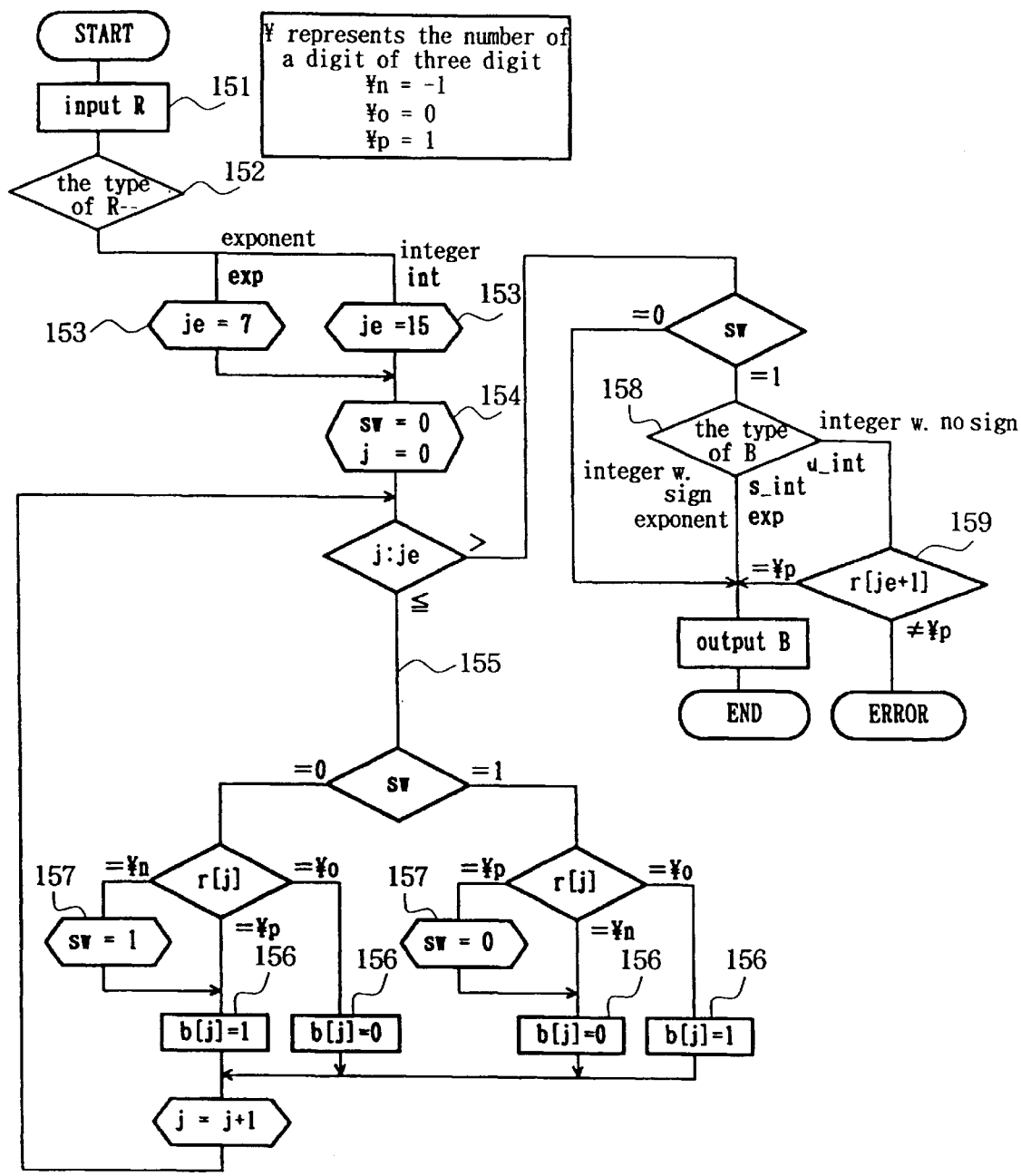
FIG. 19 is a flow chart showing a conversion process from three digit redundant binary number to two digit binary numbers.

FIG. 19 is a flow chart showing how to proceed conversion (65) of three digit redundant binary number (66) to two digit binary number (55): The conversion (65) shown in FIG. 19 aims at the integer type of data, both are different in the range of values which express as integer. In this connection, as shown in FIGS. 6 and 7, in respect to the wide or narrow space of the range of values expressed as integer, even with the same number of digits, HEN2 (77) is wider than two digit binary numbers (55).

Since HEN2 (77) is equivalent to a subset of three digit redundant binary numbers (66), the range expressed by HEN2 (77) is not wider than three digit redundant binary numbers (66), so that it is natural that three digit redundant binary numbers (66) has a wider range than two digit binary number (55). Since conversion (65) is made from the wider three digit redundant binary number (66) to narrower two digit binary number (55), there may be cases when the resultant number of digits will be large than the bit number of two digit binary number (55). But, here, the numerical value of three digit redundant binary number (66) to be converted is assumed to be smaller than the range, thus neglecting the description of the check in FIG. 19.

In the conversion (65), since conversion is made so as to express "n" digit other than sign bits by "p" and "o", when treatment is made in backward sequence, the process to be made from the time finding "n" digit to next time finding "p" digit makes different treatment than the initial condition. In this condition, sw holds either of the two conditions. When the loop is completed, for the cases of signed exponent (27) and signed integer (25), sw indicates positive if the condition is the same as the initial condition, and negative if different condition. In the case of unsigned integer (26), since the data is limited to positive, right or wrong judgment should be done along with the 16th digit of integer (35) of three digit redundant binary number (66).

When receiving (at Step 151) three digit redundant binary number (66) to be converted, identification (Step 152) is made for which type of the numbers shown in FIG. 4 is aimed at, and then the number of the most significant bit of two digit binary number (55) as the object of this conversion is set to je (Step 153), and finally sw and j are set to the initial condition (Step 154). When proceeding into loop (Step 155), depending upon combination of the marked j-th digit and status information that sw holds, as shown in FIG. 19, either signal "0, 1" is placed to the j-th bit of the two digit binary number (55) (Step 156), and sw is changed as required (Step 157). After the conversion up to the je-th bit is finished to complete the loop, in the case when sw's status expresses negative, and when the type of the two digit binary number (55) is unsigned integer (26), the unsigned integer is identified (Step 158). Further, depending upon whether the 16th digit of the integer (35) of the three digit redundant binary number (66) is "p" or not, discrimination is made whether it is error (Step 159).

Before entering into the description of the real number type of conversion, the real number type of data structure is described using FIGS. 3, 5 and 20: The data structure shown in FIG. 3 may be used when outputting the data to other devices via the two-value output device (23) or when receiving the data from other devices via the two-value input device (22). When internally making operational treatment, mainly a data structure shown in FIG. 5 is used and a portion of data (173) and exponent (37) are placed on the three-value register (31). Therefore, the data structure shown in FIG. 3 is a self-contained structure including numerical data, while the data structure shown in FIG. 5 is of an indirect address mode, by which the data portion of numerical values and the region having information of the numerical values are separately placed in different places. In this connection, it goes without saying that: data structure inputted from other devices via the two-value input device (22) is not limited to the one shown in FIG. 3, and, even if otherwise, interpretation can be made to convert them to the format shown in FIGS. 3 or 5.

Real numbers in the data structure shown in FIG. 5 have two following types (38, 39): a floating-point type (38) which has mantissa pointer (163) and exponent pointer (164) and a fraction type (39) which has numerator pointer (165), denominator pointer (166) and exponent pointer (164). Both types have essential information (167) additionally. The essential information (167) includes such indexes as indicating whether the real number is positive, zero, or negative, so that, without keeping track of the pointers to read numerical data, the content of numerical values can be identified. The exponent is an integer, while either of mantissa, numerator and denominator is a number including a decimal point, for which there are two different types: floating-point type indicating the position of decimal point, and fixed-point type fixed to predefined position. According to the embodiment, since numbers to be used for mantissa, numerator and denominator can be of common format, we call them "rule number". In short, a floating-point type of real number (38) consists of one rule number (171) and one exponent (37), while a fraction type of real number (39) consists of two rule numbers (171) and one exponent (37).

As shown in FIG. 5, when the data structure of a floating-point type of real number (38) and the structure of the portions of numerator and exponent of a fraction type of real number (39) have been previously given similar structure, a floating-point type of real number (38) added with rule number representing 1 as denominator becomes a fraction type of real number (39), and a fraction type of real number (39) removed by denominator portion may be easily used as a floating-point type of real number (38). The same thing can be said to the data structure to be placed on the two-value register (21) shown in FIG. 3. In short, when the data structure of a fixed-length fixed-point type of mantissa with exponent (28) and the structure of the portions of numerator and exponent of a fixed-length fixed-point type of fraction with exponent (29) have been previously given similar structure, conversion to be made between them are easy.

With the data structure shown in FIG. 5, exponent pointer (164) directly indicates the location of an integer type exponent (37) shown in FIG. 4, while either of mantissa pointer (163), numerator pointer (165) and denominator pointer (166) has a pointer indicating the location of rule number (171). Data of variable-length floating point (173) are utilized, keeping track of data region pointer (172) which rule number has. When such data structures have been prepared, since numerical values to be placed on the three value register (31) and the three value memory (34) can be expressed only by exponent (37) and data of variable length floating type (173), a floating-point type of real number (38), a fraction type of real number (39) and rule number (171) can be placed at best position for the treatment system, irrespective of the two-value register (21) and the three-value register (31). In this connection, also with the data structure shown in FIG. 5, placement of both of exponent (37) and data of variable-length floating point (173) on the three-value register (31) or the three-value memory (34) is not necessary, and when data of variable-length floating point (173) is placed on three-value register (31), eight bit exponent (29) shown in FIG. 2 may be placed on the two-valued register (21). In FIG. 5, the respective clusters of rule numbers and exponents are drawn as a rule number group and an exponent group, but their grouping is not always required, but they may be placed separately.

Since the rule number (171) is expressed by the number of the most significant digit (174) representing a space to be secured as the region of data (173), and the pointer (172) of the data region, variable length is easier for use, and the data structure can easily correspond to the movement of decimal point in the number of the floating point digit (175). When a numerical number placed in the region of data (173) is to be processed in an arithmetic operation, when handling finite decimals, only the number of the non-zero most significant digit (176) to the number of the non-zero least significant digit (177) are enough to be processed, but when handling approximate values, to separate the range of effective digits and the range of error, the value has the number of the effective-range least significant digit (178) too. As with the essential information (167), to identify the content of the numerical values without reading data (173) by keeping track of data region pointers (172), provided are as follows:

an index (181) indicating positive, zero or negative rule number;

a gos index (182) indicating the magnitude of the absolute value of rule number;

an index (183) indicating whether rule number is finite decimal or approximate value; and an index (184) indicating whether the data (173) is three digit redundant binary number (66), HEN2 (77), compressed HEN2 (88), nonredundant symmetric ternary number (99), or two digit binary number (55). But provision is not limited to the above, and all indexes are not always indispensable.

Of these indexes, in the case of HEN2 (77), when a decimal point is placed between the non-zero most significant digit and an adjacent digit in the lower order side, if the non-zero most significant digit of signal and the next non-zero digit (we call here as non-zero higher order second digit) of signal are the same, the abstract value of the gos index (182) is larger than 1, if they are different, the abstract value is smaller than 1, and (3) if all the digits other than non-zero most significant digit are "o", the abstract value is one, so that the gos index has such three identifications as described above.

FIG. 20 is exemplified tables showing various notations of same numerical values: In these tables, some numerical values are written as illustrative examples, but, here, zero digit of "0" bit and "o" digit of signal are omitted, because they may be self-evident without entry. In the case of infinite decimals, and approximate values with a large number of digits, three dots are substituted for lower order digits.

FIG. 20(A) shows the case of integer. Integers 75 and 107 (231) of decimal number (10) are expressed by other notations as follows;

Integers (232) by HEN2 (77) have a unique relation between them as described in FIGS. 6 and 7. Their notations become the ones shown in FIG. 20(A). This can be confirmed by giving 2 to the power weighting to each digit of the integers (232) by HEN2 (77) to determine the sum. In the case of floating decimal type of HEN2, a decimal point is placed between the first digit of integer and its adjacent lower order digit, and the value of exponent may be zero. But, in the case of arithmetic operation (particularly multiplication and division), it is better that the decimal point position of mantissa is placed between non-zero most significant digit and adjacent lower order digit so as to have only one digit of integer portion. Therefore, regarding it as the standard form of floating-point type, decimal point is so moved as to come to the position. Placing the number of digits to which decimal point is moved on exponent can obtain the standard form (233) of floating point type by HEN2 (77).

Procedure for changing these integer numbers to fixed-length fixed point mantissa type (28) of two digit binary number (55) are as follows: A signal (such as 0) showing whether mantissa is positive or negative is placed in sign bit (sign). More specifically, sign is 0 when non-zero most significant digit is positive "p", while sign is 1 when negative "n". Next, since the abstract value of mantissa is smaller than 1 when the non-zero most significant digit of mantissa and non-zero second significant digit are different, like the gos index (182), gos bit is made to 1. Since the abstract value is larger than 1 when the above two signals are same and when all the digits other than non-zero most significant digit are "o", gos bit is made to 0. Non-zero most significant digit of information which has been included in sign bit can be omitted. Since the next digit never fails to be "o" because of HEN2 (77) structure, it can be reproduced even if neglected, so that recoverable information even if without indication are neglected so as to compact as much information as possible in the bit number of two digit binary number (55) assigned as fixed length. Thus, two digits placed across decimal point of mantissa are neglected.

In this connection, since this data structure of fixed decimal point mantissa type with exponent (28) of two digit binary number (55) cannot express zero, zero number is expressed by an exponent with a specific value. This embodiment uses an exponent which is expressed as −128 by the decimal system (that is, when 8 bits of two digit binary number is 10000000). Similarly, in the case of fixed decimal point fraction type with exponent (29) of two digit binary number (55) too, the exponent of −128 expresses zero number, but the fixed decimal point fraction type with exponent (29) does not use the 127th bit, so that this bit may be used to discriminate zero and non-zero.

In the flow chart shown in FIG. 19, since bit 1 of two digit binary number (55) in the digits other than sign bit expresses positive value, conversion (65) is made so as to use only "p" and "o" but "n" (that is, "n" is deleted). However, according to the embodiment, contemplating using a three digit redundant binary number (66) which is converted in order that signals of non-zero digits which are the same as non-zero second higher digit are left and other signals of non-zero digits are deleted, substitution to two digit binary numbers (55) is made, corresponding the zero digit of "o" to 0 and non-zero digits to 1. This is a conversion (75) from HEN2 to two digit binary number. Apart from this, a conversion (65) in which exponent portion is taken as the aforemetioned integer can create a fixed point mantissa type with exponent (28) of two digit binary numbers (55). Further conversion (56) of the two digit binary numbers (55) shown in FIG. 15 allows positive or negative to be known by sign bit "sign". Therefore, compensation of two digits, which are inserted with omitted decimal point, can create a floating-point type (235) of three digit redundant binary number (66). Further conversion (67) as shown in the aforementioned FIG. 16 can create a floating-point type (233) of HEN2 (77).

Now, let us have the data structure of a fixed point mantissa type with exponent (28) of two digit binary numbers (55) as such (as described above): A sign bit "sign", in which 0 and 1 are shuffled to each other, is changed to a number having the same absolute value but positive and negative signs shuffled, that is an additive inverse number symmetrical to zero. Similarly, a gos bit "gos", in which 0 and 1 are shuffled to each other, is changed to a number having an absolute value symmetrical to one, without shuffling positive and negative signs. More particularly, $$\text{When } b>0, a=2-b \text{ When } b<0, a=-2-b=-2+|b| \qquad \text{(Equation)}$$

This is the same as b and a are shuffled in the above equation.

FIG. 20(B) shows a fraction type of real number (39) in which numerator is 75 and denominator is 107: Since a fraction number expresses the ratio of two numbers, when numerator and denominator are expressed by the same notation, the ratio will not change, thus resulting in right substitution. With a fraction number (20) expressed by decimal numbers (10) given, changing both of numerator and denominator to HEN2 (77) will make a fraction (241) by HEN2. When placing a rule number by HEN2 (77) to the numerator and denominator, and replacing the exponent by the difference between the exponents of numerator and denominator, the exponents are integrated into one exponent, thus creating the fraction type (242) by HEN2 (77). Further, after the aforementioned conversion (75) is made to the numerator and denominator, sign bit is taken as 0 or 1 when sign bits of numerator and denominator are the same or different, a bit equivalent to the sign bit of denominator is made to 0, and a conversion (65) as an integer is made to exponent. Then, obtained is a fixed-point fraction type with exponent (29) of two digit binary system (55). Further, a conversion (56) as shown in FIG. 15 can compensate so far omitted two digits placed across the decimal point, thus creating a fraction type (244) of three digit redundant binary system (66).

FIG. 20(C) is an example where an approximate value of infinite decimal is converted to floating-point type of real number (38): The numerical value to be handled here is a reciprocal number of 107. How to calculate this numerical value will be described later using FIGS. 24 to 26, as an example of arithmetic calculation. The numerical value 107 in the decimal system (10) is a prime number, so that its reciprocal number becomes an infinite recurring decimal in every case of the so far described notations. Recurring decimals or irrational numbers are infinite decimals, but since only a certain number of digits can be used when using them in calculation, they are replaced by a limited digit of approximate values. When the approximate values are given as a real number type of two digit binary numbers (55) shown in FIG. 3, the numbers must be replaced by their approximate values of the number of digits, but, when a resulting number has more number of digits, since the region in which data (173) of HEN2 (77) are placed has variable length as described previously, this variability can be utilized so as to obtain a good accuracy of calculation result. Further, when HEN2 (77) is converted to two digit binary number (55), HEN2 (77) has such characteristics as follows: When making an approximate value by truncating a numerical value, trimming off lower digits than certain non-zero digits (assuming them as effective range) can allow the trimmed portion (that is, a numerical value which the digits changed to zero signals "o" by the trimming originally had) to enter the range of (2 to the power of non-zero digits at the trimming boundary + or −⅓), thus reducing the possible error to be generated when approximate values are obtained by trimming off the number of digits.

As described previously, since the numerical value shown in FIG. 20(C) is a reciprocal number of 107 by decimal system (10), it is an infinite decimal (251) in the two digit binary system (55), and an infinite decimal (252) too in HEN2 (77). When it is converted to floating-point type (253) of HEN2 (77), it becomes a finite digit of approximate value. Further, it can be converted to a fixed point mantissa type with exponent (28) of two digit binary system (55) using the same procedure as described in (A), and further to a floating point type (255) of three digit redundant binary system (66).

Figure 21:
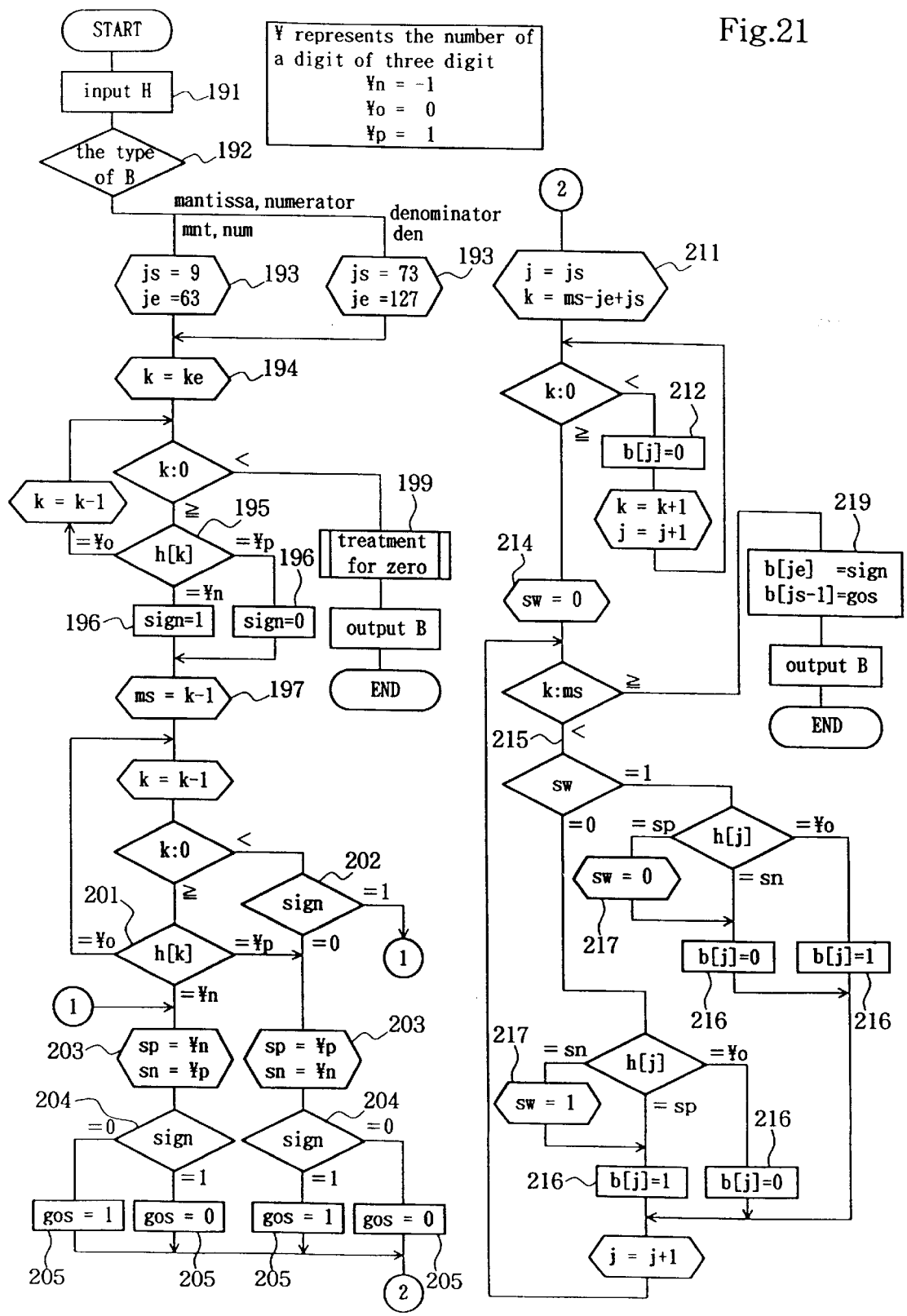
FIG. 21 is a flow chart showing a conversion process from HEN2 to two digit binary numbers.

FIG. 21 is a flow chart showing a conversion (75) of HEN2 (77) to two digit binary number (55): This conversion is used when converting data (173) pointed by a pointer (172) in the data region of a rule number (171). When receiving a data (173) of rule number (171) of HEN2 (77) to be converted (step 191), the usage of the rule number expected after conversion is identified (step 192), and then bit numbers depending on the identified usage shown in FIG. 3 is set to js and je (Step 193). Next, the number of the most significant digit (174) in the region is given k (Step 194), to search from the higher order digit downward whether it is non-zero digit (Step 195). When a non-zero digit is found first, the digit is non-zero most significant one, so that 1 bit number to be placed at sign bit is given to "sign" (Step 196), and the number of a lower side digit adjacent to the non-zero most significant digits set to "ms" (Step 197). When any non-zero digit is not found, it is a signal "o" indicating all digits are zero, or the numerical value is zero, so that the conversion is finished after some treatment for zero is made (Step 199). In this connection, when rule number is a numerator or a mantissa, the numerical value is zero, so that the treatment for zero (Step 199) the numerical value is changed to a two digit binary number (55) expressing zero as described previously, but if it is a denominator, some treatment such as handling it as error must be done. Its detail is omitted in the flow chart, because this treatment deviates from the very conversion (75) to be described in FIG. 21.

The process for searching the number of this non-zero most significant digit may be the one for searching the number of the non-zero most significant digit (176) of the rule number (171) shown in FIG. 5, if applicable. Further, when, while shifting down the number of the digit "k" one by one, non-zero second higher digit is found out (Step 201), the signal at the digit is set to "sp". Otherwise, if not found, "sign" is discriminated (Step 202), the same signal as non-zero most significant digit is set to "sp", and a different non-zero signal is set to "sn" (Step 203). And then, discrimination is made whether the signal of the non-zero most significant digit and the one of non-zero second higher digit are same or different (Step 204). When they are same, "gos" is set to 0. When different, "gos" is set to 1. The number of 1 bit to be set to the "gos" bit is secured (Step 205).

The least significant bit number "js", which is the place where the two digit binary number obtained by rule number conversion is to be placed, is set to "j", and the number of the digit of corresponding HEN2 (77) is set to "k" (Step 211). When k is negative or lower than the number of the non-zero least significant digit (177) of the rule number shown in FIG. 5, the lower order bits of two digit binary number (55) are buried with 0 (Step 212). In the case of much number of digits of HEN2 (77), unnecessary number of digits are truncated. A possible error caused by this truncating is within 2 to the power expressed by the non zero least significant digit converted to two digit binary number (55) + or −⅓.

"sw" is set to 0 (initial condition) (Step 214) to enter a loop (Step 215). In the loop, a conversion is made as follows: Sequentially from the lower order digits, depending on sw state (0 or 1) and combination of one digit by one digit signals of HEN2 (77), sn signal is deleted and sp and "o" signal are left. At the same time, one bit by one bit are placed to corresponding two digit binary numbers (55) (Step 216). "sw" is changed as required (Step 217). When the conversion up to one digit before ms digit, that is the second digit from the non-zero most significant digit, is finished, the loop is completed. And then, "sign" bit is placed to the je-th bit to make it sign bit, and "gos" is placed to the (js−1)-th bit to make it gos bit (Step 219).

Conversion (75) of a floating point type of real number (38) in FIG. 5 to a fixed point mantissa type with exponent (28) in FIG. 3 can be made by adding a converted exponent (37). On the other hand, conversion (75) of a fraction type of real number (39) to a fixed point fraction type with exponent (29) can be made as follows: After this conversion is made to respective rule numbers of numerator and denominator, an "exclusive OR" operation of sign bits of numerator and denominator. The calculated result of "exclusive OR" is placed to sign bit of the total fraction of bit number 63, and the bit of the bit number 127 equivalent to the sign bit of denominator is set to 0. Addition of converted exponent (37) completes the conversion (75).

Conversion of the real number of two digit binary number (55) shown in FIG. 3 to the real number on the three value register (31) shown in FIG. 5 is made as follows: After the conversion (56) shown in FIG. 15 is converted to three digit redundant binary number (66) using the conversion (67) shown in FIG. 16, the obtained three digit redundant binary number (66) can be made to HEN2 (77) using the conversion (67) shown in FIG. 16, as required. Now, description will be made for the process in which real numbers are converted using the conversion (56) shown in FIG. 15.

Receiving the rule number of two digit binary number (55) to be converted (Step 101), identification is made for which one of the rule numbers shown in FIG. 3 is concerned (Step 102). The number of the least significant bit is set to js, and the number of the most significant bit is set to je (Step 111). The content of sign bit is set to ss (Step 112). At that time, the mantissa and numerator are given the same positive or negative signs as the sign bits. To give the denominator positive sign, ss is set to 0 for the denominator. When ss and gos bit are the same, that is when positive and absolute value is larger than 1 or negative and absolute value is smaller than 1, "p" is set to sp, if otherwise, "n" is set to sp (Step 114). Thus, when making conversion (56) of two digit binary number (55) to three digit redundant binary number (66), a non-zero digit signal "p" or "n" is prepared so as to place one of them to the digit of three digit redundant binary number (66) corresponding to 1 of two digit binary number (55).

The 0-th digit is corresponded to the lower order js bit (Step 115). When the bits of two digit binary number (55) are "0", "o" is set to the corresponding digits of three digit redundant binary number (66) sequentially from the js bit. When "1", sp signal is set (Step 117). This process is made just in front of je bit, thus completing the loop. Then, "o" is set to the digit corresponding to je bit (Step 118), and non-zero digit signal "p" or "n" is set to the digit corresponding to (je+1) bit, depending on ss (Step 119). This non-zero digit signal comes to the non-zero most significant digit, thus giving the rule number positive or negative sign.

In this connection, the space of the data region (173) of rule number is assumed to have been prepared for the number of digits necessary for this conversion, thus omitting the check. Setting of various information which the rule numbers (171) shown in FIG. 20 should have is also omitted.

Now, description is made for arithmetic and logic operations by using various notations shown in FIG. 1: As described previously, the compressed HEN2 (88) and the compressed four digit binary number (44) are variations of HEN2 (77) to compress the number of digits, thus not suitable for calculation by their compressed forms. Therefore, when they are to be used for calculation, first, they are converted to HEN2 (77) or three digit redundant binary number (66). On the contrary, arithmetic calculation (11, 14, 16, 18) and logic operation (12, 15, 17, 19) are prepared in a direct way for any of two digit binary number (55), three digit redundant binary number (66), HEN2 (77) and three digit ternary number (99). But there is one exception of HEN2 (77): Calculation may result in three digit redundant binary number (66) more often than HEN2 (77) equivalent to the subset of three digit redundant binary number (66). Therefore, if HEN2 itself is required, further conversion is required.

Logic operations may be mainly used for following treatment: When the procedure of addition operation is broken down, the treatments of digits and carry digits are required to determine the sum for combination of one digit by one digit augend and addend. But, they are not limited to the above. Further, three value logic operation can make more complicated operation than two value logic operation, so that, here, arithmetic operation is exemplified for more specific description of the logic operation, thus showing only addition table.

Among the four addition tables shown in FIG. 22, any of an addition table (301) of two digit binary number (55), an addition table (302) of three digit redundant binary number (66), and an addition table (303) of HEN2 (77) is a combination of two digits of augends and two digits of addends. Two digit binary number (55) and three digit redundant binary number (66) have no restrictions for adjacent digit, so that both of addends (310, 311) and augends (315, 316) have four (2×2) notations by two digit binary number (55), while nine (3×3) notations by three digit redundant binary number (66). In HEN2 (77), however, at least one of two adjacent digits is a signal "o" indicating zero. Therefore, when selecting digit positions so that the digit comes to lower order side of the two digits in reference to the non-zero digit of addend (312), addends (312) have only three notations while augends (317) have only 5 notations.

With HEN2 (77), as the addition table (303) shows, when non-zero digit of addend (312) is taken as two digits of lower order side digit, non-zero digit of augend (317) becomes the same lower order digit or adjacent higher order digit. With adjacent digit, carry digit does not take place, thus obtaining the sum of three digit redundant binary numbers (66) whose side by side digits became non-zero digit (321). In the case when the digit positions of both non-zero digits are the same, when both non-zero digit signals are different (that is, "p" and "n"), the signals are canceled to each other, thus resulting in "o" (322), while when they are the same, carry digit of signals takes place to make the digit "o" (323). As described above, when the non-zero digits of addend (312) and augend (317) occupy the same digit position, either of two adjacent digits is zero digit. Both digits adjacent to the high order side digit to which digit is carried up are zero digit. Therefore, the carry digit treatment never fails to stop at the digit, thus eliminating the chance of chained carry digits. This characteristics of arithmetic calculation of HEN2 (77) is quite different from those of two digit binary numbers (55) and three digit redundant binary numbers (66).

Since it is not necessary to compare the addition table (304) of three digit ternary number (99) with the addition table (303) of HEN2 (77), addends (314) and augend (319) both are shown only by one digit. In this case too, since there is no restriction for the adjacent digits, when two digits are selected, addends (314) and augend (319) both have nine (3×3) notation alternatives of 3 to the 2nd power.

Generally, in multiplication, when a multiplier is 1, the product is equal to the multiplicand, while when a multiplier is zero, the product is zero for any multiplicand. When a multiplier is −1, the product is an additive inverse number of multiplicand, that is, a number of which absolute value is equal, with (positive or negative) sign reversed. Multiplication is made as follows: a multiplicand is multiplied by a one-digit partial multiplier to obtain the partial product. When the multiplier has a plurality of digits, several partial products are obtained, where the number of partial products equals to the number of non-zero digits of the multiplier. Then, respective partial products are arranged to digit positions corresponding to the ones of respective partial multiplies. Addition of those partial products produces the intended product.

In this connection, a signal to be handled on the two-value register (21) has digits whose respective numerical values are either one of {0, 1}, while a signal to be handled on the three-value register (31) has digits each of which is either one of {n. o, p} representing {−1, 0, 1}. Now, the multiplication of notations shown in the embodiment is as follows: When a multiplier (326) is broken down into one digit by one digit, in any case their values are either one of 1, 0, or −1, so that their partial products result in the multiplicand itself, zero or the multiplicand with reversal sign. More particularly, as shown in FIG. 23, when either one of the multiplication table (306) of two digit binary number (55), the multiplication table (307) of three digit redundant binary number (66), the multiplication table (308) of HEN2 (77), and the multiplication table (309) of three digit ternary number (99) is multiplied by one digit of multiplier (326), the product becomes the multiplicand itself, zero or the multiplicand with reversal sign. Therefore, when making multiplication of multiplicand (327) and multiplier (326), partial products equal to the multiplicand and partial products equal to the multiplicand with reversal sign are arranged to the digit positions corresponding to the non-zero digits of multiplier to obtain their sum. The actual example will be illustrated in the description of division.

Figure 24:
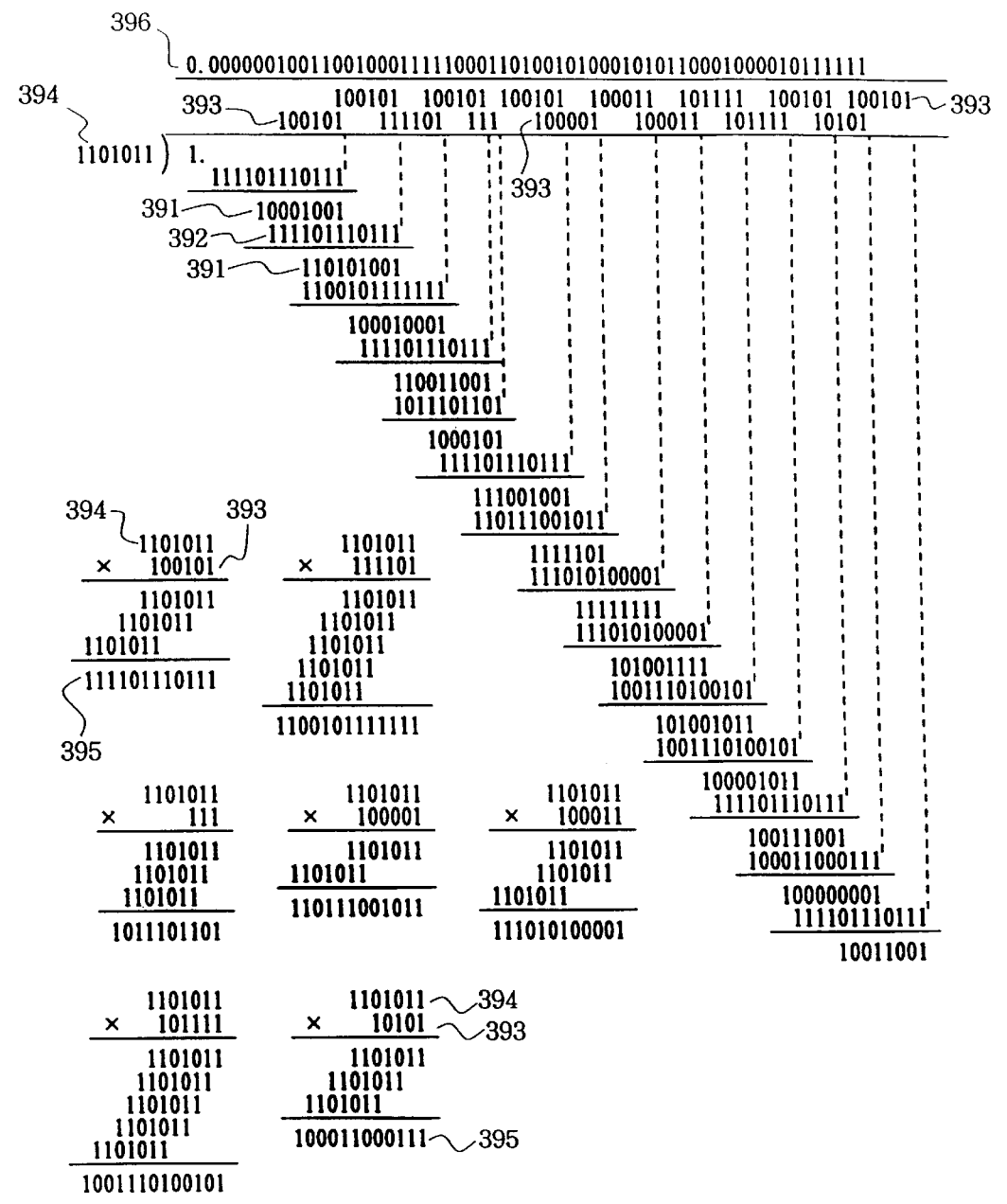
Figure 25:
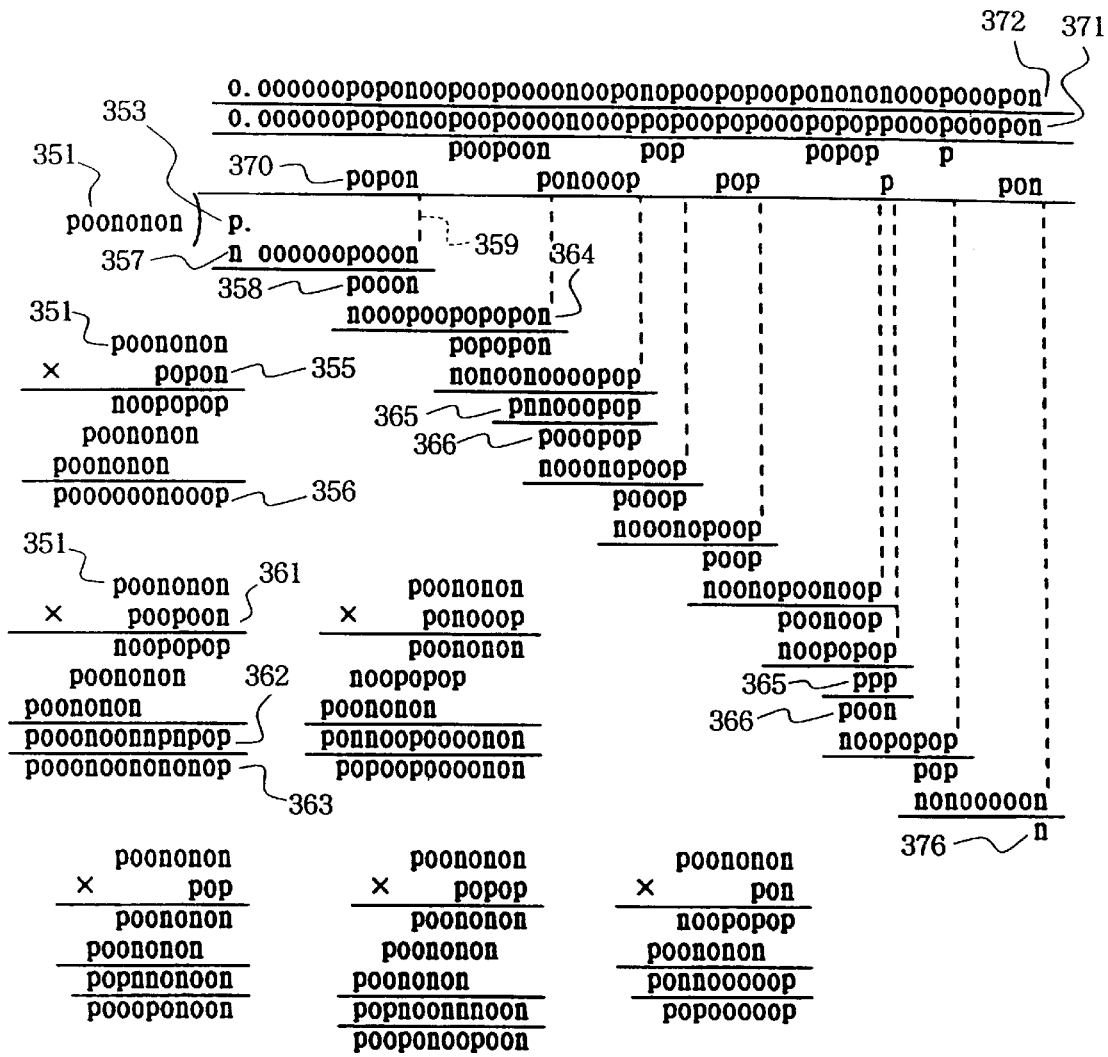
FIG. 25 is an illustration showing an example of divisional operation of HEN2.
Figure 26:
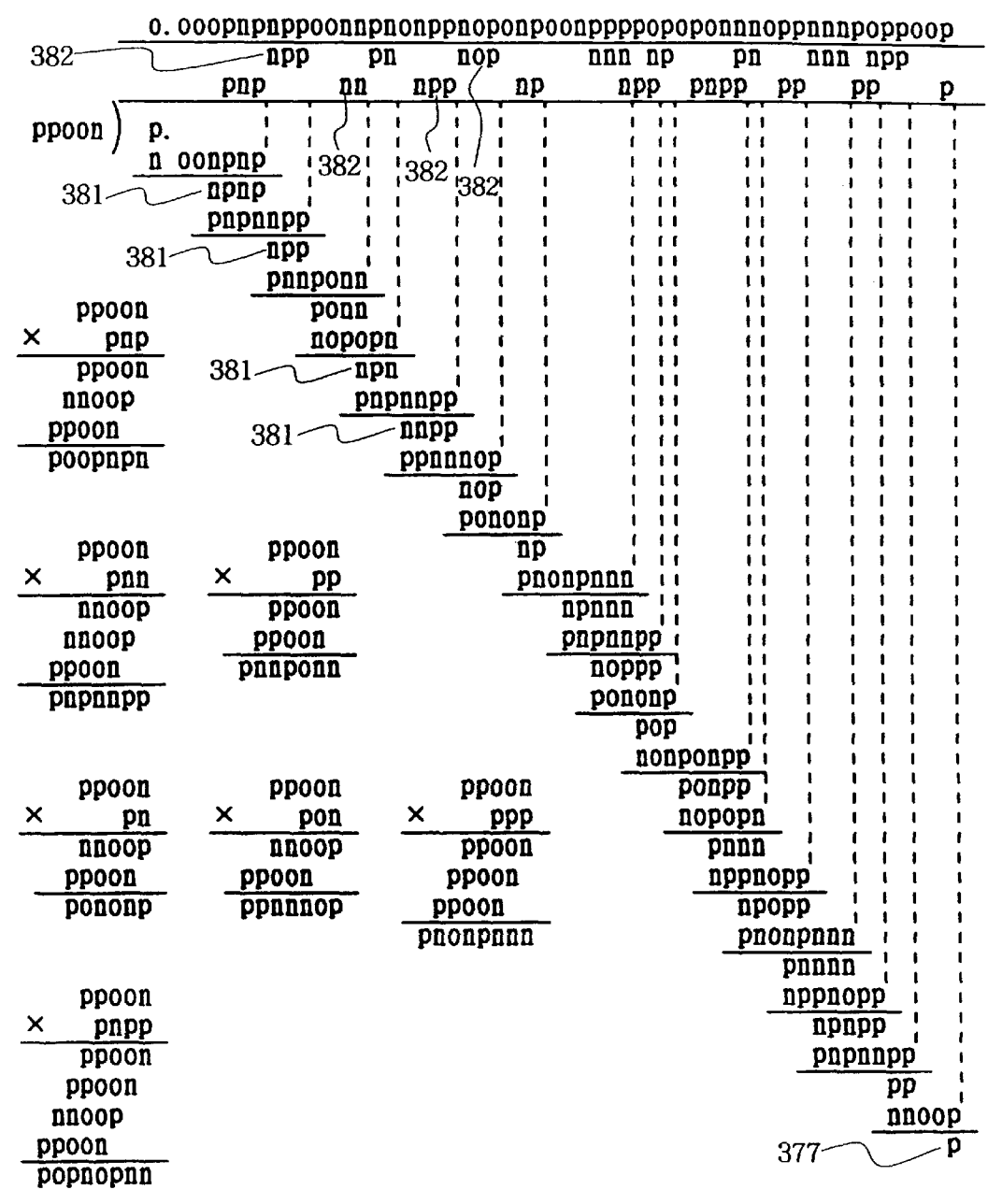
Figure 30:
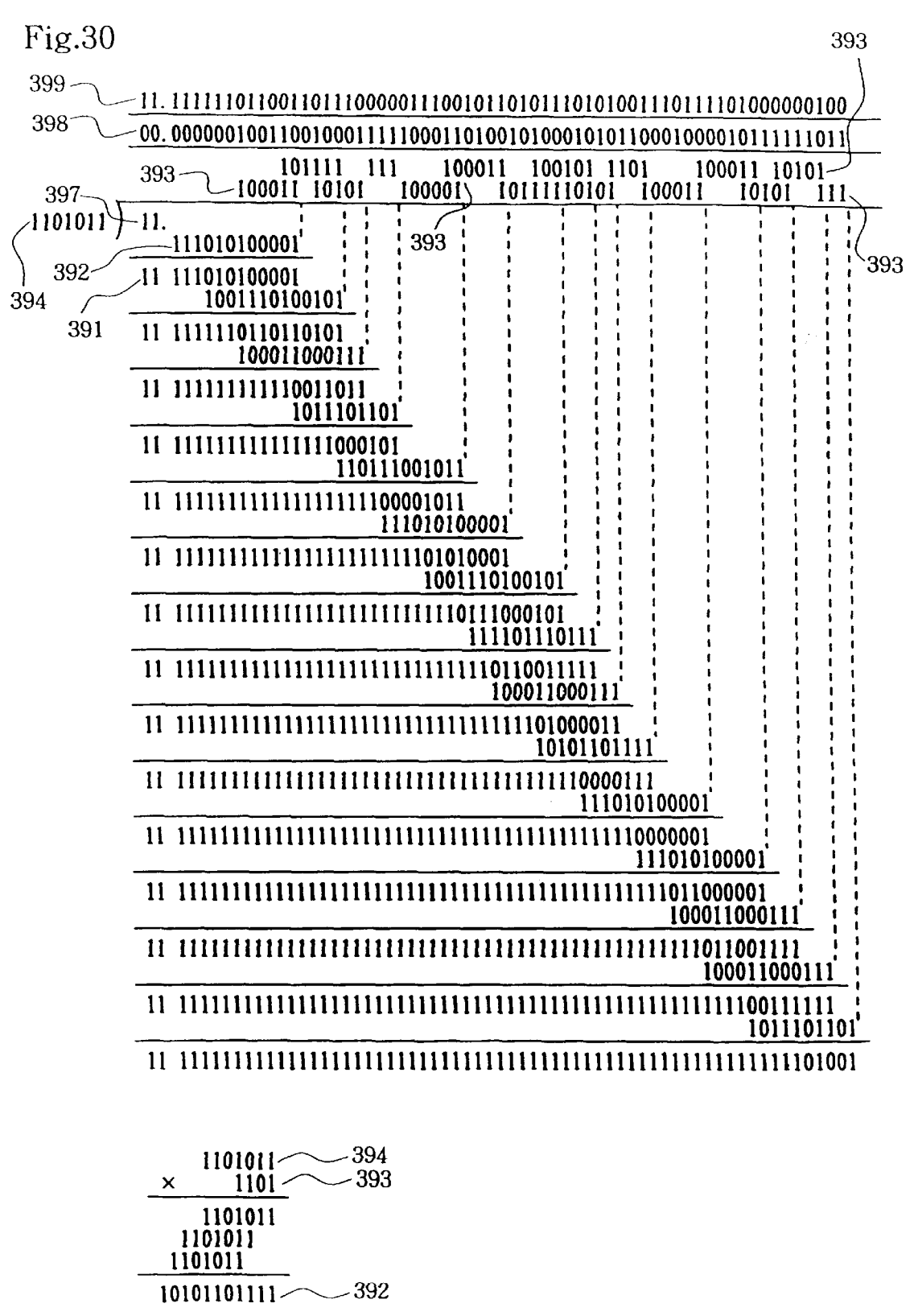

Now, the actual examples of division will be shown in FIGS. 24, through 26 and in FIG. 30: As shown in FIG. 17, because of redundancy, three digit redundant binary numbers (66) are not easy to identify which is larger, only by looking at the number of digits, thus resulting in inadequacy for division, so that the numbers (66) will be excluded from the samples. FIG. 24 shows the division sample of two digit binary numbers (55), FIG. 25 shows the division sample of HEN2 (77), and FIG. 26 shows the division sample of three digit ternary numbers (99), in which the reversal number of 107 in decimal notation (10) is obtained by respective notations. Usually, division calculation in longhand is made by repeating determination of the one-digit partial quotient. Here, division coefficient tables (331, 332, 333) as shown in FIGS. 27 through 29 are used to determine one or more digits of partial quotients, thereby minimizing the calculation time. Substitution of the divisional operation steps exemplified by these drawings to the procedure of digital numerical value/signal processing can realize an operation using digital numerical values and signals.

The division method for HEN2 is described in reference to the calculation example in FIG. 25 and to a coefficient table in FIG. 28: The coefficient table (332) in FIG. 28 is used as follows: A lateral line is drawn from a divisor in a "left seven digits of divisor" column (344) at the most left side of the table. A vertical line is drawn from a dividend in a "left five digits of partial dividend" column (345) at the top of the table. A notation or number in the intersection of both lines is a coefficient (346) equivalent to the partial quotient to be determined. In the course of division calculation, the divisor is constant, so that when a divisor (351) is given, the lateral line of the coefficient table in FIG. 28 can be specified. When the number of digits of a divisor is less than seven or the number of digits of the dividend or partial dividends is less than five, you can put "o" to the lower order digit(s) for use of the table. Since only positive numbers are written in the table, when a divisor is negative number, or dividend or partial dividends is negative, you can specify using their absolute value. In the course of divisor calculation, when the positive or negative sign of divisor, and dividend or partial dividends are the same, since partial quotients are positive, the coefficient becomes partial quotient, while, when different, since partial quotients are negative, an additive inverse number of the coefficient becomes partial quotient.

According to the example shown in FIG. 25, since the divisor (351) is poononon, the higher order seven digits (poonono) is used to specify the relevant row (352) of the table. Since dividend (353) is p., first it is taken as poooo (354). Then, the coefficient (popon) (355) is obtained as the intersection in the coefficient table of FIG. 28. When the product (356) of the divisor (351) and the coefficient (355) is determined, this is the product of the divisor and partial quotient, that is partial product. Instead of subtraction of partial product from dividend, you can add the additive inverse number of partial product. In other words, since the additive inverse number (357) of partial product cancels the higher order digit of dividend, the additive inverse number (357) is placed under the dividend (353) with the most significant digit position matched to determine a sum (358) with dividend, this resultant becomes the next partial dividend. When coefficient (355) or the additive inverse number of coefficient is written so as to match the least significant digit position (359) of the partial product or the additive inverse number (357) of partial product, this becomes the partial quotient (370). From the next partial dividend (or if negative, its additive inverse number) pooon (360), coefficient poopoon (361) is obtained. When the calculation of the product (362) with divisor is made, non-zero digits are lined up side by side, so that the three digit redundant binary number (66) is converted (67) to HEN2 (77) to make it the partial product (363) of the HEN2 (77). At the time when the sum of partial dividend and the additive inverse number (364) of partial product are determined, too, there may be a chance of lined-up non-zero digits (365). In this case also, conversion (67) is to be made to make it the partial dividend (366) of HEN2 (77).

In this calculation example, several partial quotients (370) are written separately in two rows. Then, their sum (371) or aggregation in series is obtained. The sum (371) of three digit redundant binary numbers (66) is converted (67) to the (final) quotient (372) in HEN2 (77). This "writing separately in two rows" is intentionally devised so as to make the calculation process more easy to understand. Of course, you can write the quotient, directly adding the partial quotients in the sum (371) of three digit redundant binary numbers (66) each time when you get a successive partial quotient. At the time when adding is made, as shown in this example, there are few digits overlapping due to offset digit position, so that carry digit rarely takes place. Therefore, it is not necessary to make conversion (67) to HEN2 (77) each time when adding is made, but you can convert the sum (371) of three digit redundant binary numbers (66) and the additional result of partial quotients (370) of HEN2 (77) to three digit redundant binary numbers (66), while looking up the addition table (302) for three digit redundant binary numbers (66).

When a coefficient (346) obtained from the coefficient table (332) are the same as those already used to determine partial products, they can be used again. When using the coefficient table (332), at most ten times of the multiplication operations for determining partial products from the coefficient (346) and divisor (351) are sufficed, because there are columns where coefficient (346) is p (=1). Therefore, the more the number of digits of quotient to be obtained, the larger the chances of reuse of the coefficients, thus minimizing the time for calculation. This can apply also to the case when division calculation of two or more dividends (353) using the same divisor (351).

In the calculation example in FIG. 25, at the time when the quotient is calculated to the fifty three decimal place, the partial dividend has returned to the additive inverse number n (376) of the original dividend. Therefore, following calculation to be made would result in only repetition of the foregoing calculation of the additive inverse number, thereby causing every digit of quotient to be the additive inverse number of the 53 digits so far made. In short, the number of digits of recurrent section is 106, and respective digits of the former half and the latter half are in the relation of additive inverse number to one other. For the division example of nonredundant symmetric ternary numbers (99) shown in FIG. 26 also, similar calculation can be made using a coefficient table (333) shown in FIG. 29. The difference from HEN2 (77) is that conversion in the course of calculation is not necessary, because non-zero digits can be lined up side by side. At the time when quotient is obtained up to the 53rd digit from decimal point, the partial dividend returns to p. (original dividend) (377), showing 53 digits of recurrent section. In this case, the number of digits are odd, thus resulting in that there is not additive inverse relation between the former half and the latter half shown in the preceding example.

Further, in the calculation example in FIG. 25, since either of the positive or negative signs of partial dividends (such as 358, 366) and a divisor (351) happens to be the same, only positive partial quotients (such as 370) are obtained. In general, however, partial quotients are not always positive. In the calculation example of a nonredundant symmetrical ternary number (99) in FIG. 26 also, you can see the case where partial dividends (381) become negative, thus having a different sign from the positive one of divisor. In these cases where the coefficient tables (332, 333) shown in FIGS. 28 and 29 are used, when the coefficients are determined from absolute values of partial dividends to make the multiplication of the obtained coefficients and divisor, the obtained product is equivalent to the additive inverse number of partial product. Since the positive or negative sign of the obtained product is different from the one of partial dividends, in the calculation of the addition of the product and the partial dividend, the higher order digits of the partial dividends are canceled. And, the partial quotient (382) becomes the additive inverse number of the coefficient. When divisor (such as 351) is negative, similar calculation can be made, as well.

In the calculation example of two digit binary number (55) in FIG. 24, the coefficient table (331) shown in FIG. 27 can be used to make similar calculation. Generally, a sign bit is used to express a negative number in two digit binary system (65). But, this is a method which purposefully uses only positive numbers to avoid the necessity to use the negative sign bit. Then both of a divisor and a dividend are positive, the additive inverse number of partial products is not added to dividend or partial dividends, but the partial products (392) are subtracted from dividend or partial dividends (391). The subtraction result becomes a next partial dividend (391), where the next partial dividend is not permitted to be negative, so that it must be positive or zero without fail. Therefore, coefficients (393) determined from the relation between divisor and partial dividends are so set as follows: the product (395) of divisor (394) and coefficient (393) or the higher order digits of partial product are not the same ones of partial dividends, but partial products (392) become smaller than partial dividends (391). Additionally, the digit positions of partial products (392) must be shifted to as highest order side as possible without overriding the value of partial dividends (391). The quotient (396) thus obtained becomes the same as the one converted from the quotient (372) in HEN2 (77) shown in FIG. 25, so that the digits lower than the 53rd decimal place of quotient (396) have been the one in which 0 and 1 are interchanged, starting from the first decimal place and downward. It may look like the former half and the latter half of a recurrent section, but not so clear as seen in HEN2 (77) shown in FIG. 25.

Since, when divisor and dividend both are negative, the quotient becomes positive, the absolute values of them can be taken, to make the aforementioned positive division.

When a divisor and a dividend have respectively a different positive or negative sign, the quotient becomes negative. FIG. 30 shows an example when a divisor has a positive sign, and a dividend has a negative sign. When the respective additive inverse numbers are used, similar calculation can be made. In the case of the calculation example shown in FIG. 30, when the data structure of the dividend is such fixed point mantissa type with exponent (28) as shown in FIG. 3, only changing sign bits can change their positive or negative, it is not convenient to show the actual example of calculation. Therefore, here, the second digit of integer is assumed to take sign bit. In short, a dividend 11. expresses $-2+1=-1$. Further when 0 bits of lower order digits than sign bit is substituted by 1, this value approaches infinitively to zero. Therefore, in such a way as the product of divisor and coefficient compensates 0 bit of dividend or partial dividend, in other words, 0 and 1 of dividend or partial dividend are reversed to use two or more bits including the non-zero most significant digit, coefficient (393) is determined from the coefficient table (331) in FIG. 27. In this connection, because the divisor (394) in the calculation example in FIG. 30 is the same as the one in FIG. 24, a multiplication calculation of determining the product of divisor (394) and coefficient (393) takes a similar process. With this coefficient table (331), one piece of divisor has eight pieces of coefficients in total, among which seven pieces have been already calculated in the calculation example in FIG. 24, so that they are reused without making calculation.

Since, according to the calculation example in FIG. 30, the dividend (397) is negative and all bits at lower order digits than decimal point are 0, in such a way as to substitute 1 for 0 bits, that is, by reversing 0 and 1 of dividend or partial dividends, and by assuming two or more bits including the non-zero most significant digit, coefficient (393) is obtained from the coefficient table (331) in FIG. 27, and the product (392) of divisor (394) and coefficient (393) is added to a dividend (397) to obtain the next partial dividend (391). Then, when the sum (398) of the coefficients (393) which are separately written so as to match the digit position of the end of respective products (392) is determined, the result becomes the same as the quotient (396) in FIG. 24, but, according to the calculation example in FIG. 30, a reversal of 0 and 1 including sign bit the quotient (399) is obtained as negative value.

The number of boxes arranged vertically and horizontally in the coefficient tables (331, 332, 333) shown in FIGS. 27, 28 and 29 are not limited to them. The number of horizontal boxes is about ten which may be easily handled in respective notations, taking consideration of how often the coefficients are used again. More number of boxes for fragmented partial dividends can be used to increase the number of digits to be obtained simultaneously. This method can shorten the time required for calculation operation. On the other hand, as with the number of vertical boxes, when divisor has been specified as described previously, the row in the coefficient table corresponding to the divisor is specified from the higher order digits of the divisor. Therefore, it goes without saying that, considering the man-hour required for determining coefficients and preparing coefficient tables beforehand, and economy of the space required to store the coefficient tables, the finer the fragmentation of classification of divisor with more boxes, the more accurate the coefficients.

Now, more detailed description will be made for the standard position of decimal point of the rule number:

When the non-zero most significant digit of positive number d in decimal system (10) is taken at the first decimal place, and the position of decimal point is arranged between the non-zero most significant digit and an adjacent digit in the higher order side, the value will range:

$$1/10 \leq d_1 < 1$$

therefore, the product of two pieces of rule numbers will range:

$$1/100 \leq d_1 \times d_2 < 1$$

The quotient of two pieces rule numbers will range:

$$1/10 < d_1 \div d_2 < 10$$

Further, when the non-zero most significant digit of positive number d in decimal system (10) is taken at the first integer place, and the position of decimal point is arranged between the non-zero most significant digit and an adjacent digit in the lower order side, the value will range:

$$1 \leq d_3 < 10$$

so that, the product of two pieces of rule numbers will range:

$$1 \leq d_3 \times d_4 < 100$$

The quotient of two pieces of rule numbers will range:

$$1/10 < d_3 \div d_4 < 10$$

Similarly to the above, when the non-zero most significant digit of positive number b in two digit binary system (55) is taken at the first decimal place, and the position of decimal point is arranged between the non-zero most significant digit and an adjacent digit in the higher order side, the value will range:

$$1/2 \leq b_1 < 1$$

so that, the product of two pieces of rule numbers will range:

$$1/4 \leq b_1 \times b_2 < 1$$

The quotient of two pieces of rule numbers will range:

$$1/2 < b_1 \div b_2 < 2$$

Then the non-zero most significant digit of positive number b in two digit binary system (55) is taken at the first digit of integer, and the position of decimal point is arranged between the non-zero most significant digit and an adjacent digit in the lower order side, the value will range:

$$1 \leq b_3 < 2$$

so that, the product of two pieces of rule numbers will range:

$$1 \leq b_3 \times b_4 < 4$$

The quotient of two pieces of rule numbers will range:

$$1/2 < b_3 \div b_4 < 2$$

For nonredundant symmetric ternary number (99) t, as disclosed in the Japanese patent applications (No. 290474/1994 (U.S. Pat. No. 5,822,233) and No. 189049/1996) which were applied by this inventor and already laid open. It is better that the non-zero most significant digit is made the first integer place, and the decimal point is placed between the non-zero most significant digit and an adjacent digit to lower order side.

The range of the value is:

$$1/2 < |t_1| < 3/2$$

Therefore, the range of the product of two rule numbers is:

$$1/4 < |t_1 \times t_2| < 9/4$$

The range of the quotient of two rule numbers is:

$$1/3 < |t_1 \div t_2| < 3$$

In both case of the above examples, since one digit does not provide the space for the product of multiplication calculation and the quotient of division calculation, after the calculation, normalization is necessary for standardizing the position of decimal point, the offset of the number of this digits caused a complication of operation procedure.

On the contrary, for HEN2 (77) h, the non-zero most significant digit is made the first integer place, and the decimal point is placed between the non-zero most significant digit and an adjacent digit to lower order side. The range of the value is:

$$2/3 < |h_1| < 4/3$$

Therefore, the range of the product of two rule numbers is:

$$4/9 < |h_1 \times h_2| < 16/9$$

The range of the quotient of two rule numbers is:

$$1/2 < |h_1 \div h_2| < 2$$

In this case, both of the product of multiplication calculation and the quotient of division calculation come in the following range, when the non-zero most significant digit of three digit redundant binary number (66) r is taken as the first digit of integer:

$$0 < |r_1| < 2$$

Therefore, it is not necessary to think the shifting of decimal point at the time of multiplication and division operations. When the product or quotient thus obtained is converted (67) to HEN2 (77) from the three digit redundant binary number (66), there may be increase or decrease in the number of digits, but the treatment can be made following the flow chart shown in FIG. 16, thus eliminating the need for special treatment.

Finally, using FIG. 31, description will be made for the conversion (79) from HEN2 (77) to nonredundant symmetric ternary number (99), and the conversion (59) from two digit binary number (55) to nonredundant symmetric ternary number (99). Using FIG. 32, description will be made for the conversion (97) from nonredundant symmetric ternary number (99) to HEN2 (77) and the conversion (95) from nonredundant symmetric ternary number (99) to two digit binary number (55). FIG. 31 is a table in which the values of integers of HEN2 (77) having only one non-zero at the most significant digit are noted by nonredundant symmetric ternary numbers (99). In the table, described are extraction cases when non-zero bit of signed integers (25) of two digit binary number (55) has only one bit, along with corresponding decimal numbers (10) for reference. To make conversion (79) of HEN2 (77) to nonredundant symmetric ternary numbers (99) against this table, nonredundant symmetric ternary numbers (99) corresponding to non-zero digit of HEN2 (77) should be selected out to obtain the sum using the addition table (304) of nonredundant symmetric ternary number (99). Similarly to the above, to make conversion (59) of signed integers (25) of two digit binary numbers (55) to nonredundant symmetric ternary numbers (99), nonredundant symmetric ternary numbers (99) corresponding to non-zero bit of two digit binary numbers (55) should be selected out to obtain the sum using the addition table (304) of nonredundant symmetric ternary number (99).

FIG. 32 is a table in which the values of integers of nonredundant symmetric ternary numbers (99) having only one non-zero at the most significant digit are noted by HEN2 (77) and signed integers (25) of two digit binary numbers (55) along with decimal numbers (10) for reference. To make conversion (97) of nonredundant symmetric ternary numbers (99) to HEN2 (77) or conversion (95) of nonredundant symmetric ternary numbers (99) to signed integers (25) of two digit binary numbers (55) against this table, HEN2 (77) or two digit binary numbers (55) corresponding to non-zero digit of nonredundant symmetric ternary numbers (99) should be selected out to obtain the sum using the addition table (303) of HEN2 (77) or using the addition table (301) of two digit binary numbers (55). FIGS. 31 and 32 assume the range of numerical values of signed integers (25) of two digit binary numbers (55) as shown in FIG. 2. When numbers of more digits are to be converted, these tables must be larger to increase the number of digits, but multiplication may be combined for this operation.

In this connection, conversions (59, 79, 95 and 97) of integers can be made only by addition, but, when numerical values include digits lower than decimal point, since the character of numbers is different depending on their base values, so far their conversion has been thought to be complicated. When they have different base values, it is well known that some numbers may be divided out, while other numbers may have recurrent decimals, thus resulting in infinitive decimals. For examples, ⅓ expressed by two digit binary system (55) is a recurring decimal of 0.010101010 . . . , but when expressed by nonredundant symmetrical ternary number system (99), it can be divided out to o. p. On the contrary, ½ expressed by two digit binary system (55) is divided out to 0.1, but when expressed by nonredundant symmetrical ternary number system (99), it becomes a recurring decimal of o. pppppp . . . .

This embodiment, however, prepares the fixed point fraction type with exponent (29) shown in FIG. 3 and the fraction type of real numbers (39) shown in FIG. 5. When the exponent is positive, by multiplying the numerator by the power of base, and when the exponent is negative, by multiplying the denominator by the power of base determined from the absolute value, the numerator and denominator both are converted into integers, then the above-described conversion method for integers are applied, thereby allowing of easy conversion. In this connection, with the example shown in FIG. 20(C), the reciprocal of 107 is changed to an approximate value of floating point type of real number (38), but when fraction type of real number (39) is used, the necessary additional operations are only to place 107 to the denominator and to change the numerator to 1. Therefore, this conversion can not only achieve fast treatment, but also can have no round-off error possible when making approximate value, thus resulting in good accuracy.

As described above in detail, the invention as described in Claim 1 is a digital data conversion method, which is characterized in that: Let us consider numbers of three digit {n, o, p} redundant binary system having one or more 2-based digits, which selects any one of three digit signals {n, o, p} expressing value {−1, 0, 1} as one digit signal. Among the numbers of three digit redundant binary system, only a combination of signals in which at least one of two adjacent digits is a signal "o" expressing zero is called here as HEN2. The HEN2 is not handled as a subset of the numbers of three digit redundant binary system, but as one specific notation. According to the invention, the HEN2 to be handled as one notation can eliminate redundancy and uniquely correspond to the numbers of two digit binary system as well as have less ratio of non-zero digits, thereby obtaining a main role in a notation system. HEN2 can take its position in between two digit nonredundant binary system and three digit nonredundant ternary system, and become an interface between them because of its nonredundancy.

Further, according to the invention, in the case of addition, adoption of HEN2 for at least one of two numbers to be processed in an arithmetical calculation never causes chain of carry digit, thereby permitting concurrent operation of addition in each digit, thus resulting in a significant reduction in operational time.

In a normal arithmetical operation, the use of HEN2 may not be effective if all the numbers is not converted to HEN2, but in the case of rare overlap of digits of numbers to be processed, which may take place when adding an additional partial quotient to the sum of partial quotients, conversion of either one to HEN2 may be effective. Only once normalization of numbers of three digit redundant binary system to HEN2 will suffice after the final sum is obtained.

In multiplication operation too, HEN2 having less ratio of non-zero digits can reduce the number of partial products by the difference, thereby allowing the calculation to be simplified, thus resulting in shorter calculation time.

Further, according to the invention using HEN2, an arithmetical operation including decimal numbers may have less round-off errors possibly taking place in approximation.

According to the invention as described in Claim 2, additionally to Claim 1, in HEN2, any non-zero digits never take their positions side by side to each other. Therefore, when the zero-digit signal "o" interposed between a non-zero digit (either one of signals "n, p") and the other non-zero digit is only one digit, at least this only one digit "o" is omitted (or cut short) to form a compression type, thus resulting in a reduction of the total number of digits, and in an easy restoration.

According to the invention as described in Claim 3, additionally to Claim 1, in HEN2, continual zero digits can frequently take place, so that coding of the number of continual zero digits can achieve a more compact compression. In other words, when digital data signals expressed by two digit binary system is uniquely converted into HEN2, and the HEN2 obtained is compressed and converted into coded two digit binary number, its data volume can be positively reduced as compared to the original.

The invention as described in Claim 4, additionally to Claim 1, uses the digital data conversion method, and has an input portion for inputting digital signals and an output portion for outputting digital signals, so that time required for an arithmetical operation is significantly shortened. In this connection, internal processing is black-boxed, so that the operator is not aware of the use of HEN2 in the converter.

According to the invention as described in Claim 5, non-zero digits in HEN2 do not appear side by side more positively than Claim 4. Therefore, when a signal "o" of zero digit taking its position in between a non-zero digit of either one of "n, p" signals and the other non-zero digit is of only one digit, at least "o" of this only one digit is omitted (compacted) for compression, thus resulting in the reduction in the total number of digits and in easy reproduction.

According to the invention as described in Claim 6, since this HEN2 may have more cases of continual zero digits than Claim 4, coding of the number of continual zero digits can all the more compress the data to be handled. In other words, when digital data signals of two digit binary number are uniquely converted into compressed and coded two digit binary numbers, data volume to be handled can be reduced as compared to the one before conversion.

According to the invention as described in Claim 7, this specific HEN2 is used when making calculation by this digital computer, while common two digit binary numbers can be used when outputting the result to remote storage media or other digital computers and inputting digital data from storage media or other digital computers. Further, when loading the digital data on communication means, compressed two digit binary number can shorten transfer time. The compressed two digit binary number can reduce the number of storage media to be required.

What is claimed is:

1. A digital data conversion method wherein:

a three digit nonredundant symmetric binary number (Hen2), which is a combination of signals in which at least one of two adjacent digits at any digit position of one or more digits of 2-based three digit redundant binary number with either one signal of three digits {n, o, p} each expressing a value{−1, 0, 1} as a one-digit signal is a signal "o" expressing zero, is handled as one independent set of notation, not as a subset of the three digit redundant binary number.

2. A digital data compression method wherein:

a three digit nonredundant symmetric binary number (HEN2), which is a combination of signals in which at least one of two adjacent digits at any digit position of one or more digits of a 2-based three digit redundant binary number with any one signal of three digits{n, o, p} each expressing value{−1, 0, 1} as a one-digit signal is a signal "o" expressing zero, is handled as one set of notation, not as a subset of the three digit redundant binary number, when signal "o" at zero digit is located between a non-zero digit which is either one of the digits "n, p" and another non-zero digit having only one digit, at least the digit "o" is omitted.

3. A digital data compression method wherein:

a three digit nonredundant symmetric binary number (HEN2), which is a combination of signals in which at least one of two adjacent digits at any digit position of one or more digits of a 2-based three digit redundant binary number with any one signal of three digits{n, o, p} each expressing value{−1, 0, 1} as a one-digit signal is a signal "o" expressing zero, is handled as one set of notation, not as a subset of the three digit redundant binary number, the number of continual zero digits being coded.

4. A digital signal and data converter comprising:

an input section to input digital signals;
   an output section to output digital signals; and
   a digital signal and data conversion section to make calculations based on the inputted digital signals for outputting, which handles the HEN2, which is a combination of signals in which at least one of two adjacent digits at any digit position of one or more digits of 2-based three digit redundant binary number with one signal of three digits{n, o, p} each expressing value{−1, 0, 1} as a one-digit signal is a signal "o" expressing zero, as one set of notation, not as a subset of the three digit redundant binary number.

5. A digital signal and data converter comprising:

an input section to input digital signals;
   an output section to output digital signals; and
   a digital signals and data conversion section to make calculation based on the inputted digital signals for outputting, which handles the said HEN2, which is a combination of signals in which at least one of two adjacent digits at any digit position of one or more digits of 2-based three digit redundant binary number with either one signal of three digits{n, o, p} each expressing value{−1, 0, 1} as one-digit signal is a signal "o" expressing zero, as one set of notation, not as a subset of the said three digit redundant binary number, and which handles digital signals with at least only one digit "o" omitted, when the said signal "o" at zero digit intercepted between a non-zero digit which is either one signal "n, p" and another non-zero digit has only one digit.

6. A digital signal and data converter comprising:

an input section to input digital signals;
   an output section to output digital signals; and
   a digital signals and data conversion section to make calculation based on the inputted digital signals for outputting, which handles the said HEN2, which is a combination of signals in which at least one of two adjacent digits at any digit position of one or more digits of 2-based three digit redundant binary number with either one signal of three digits{n, o, p} each expressing value{−1, 0, 1} as one-digit signal is a signal "o" expressing zero, as one set of notation, not as a subset of said three digit redundant binary number, and which handles digital signals in which the number of continual zero digits are coded.

7. A digital computer characterized in having one of the digital signals and data converters as claimed in Claim 4.

8. A digital data conversion method wherein:

a three digit nonredundant symmetric binary number (HEN2), which is a combination of signals in which at least one of two adjacent digits is a signal "o" expressing zero at any digit position of one or more digits of a 2-based three digit redundant binary number with one signal of three digits{n, o, p} each expressing a value{−1, 0, 1} as a one-digit signal, is handled as one independent set of notation not as a subset of the three digit redundant binary number.

9. A digital data conversion method wherein:

a three digit nonredundant symmetric binary number (HEN2), which is a combination of such signals, which are selected from a 2-based three digit redundant binary number with either one signal of three digits{n, o, p} each expressing value{−1, 0, 1} as one-digit signal, as at least one of two adjacent digits at any digit position of one or more digits is zero (the signal is "o"), is handled as one independent set of notation, not as a subset of the three digit redundant binary number.

* * * * *